(12) United States Patent
Xia et al.

(10) Patent No.: US 8,257,465 B2
(45) Date of Patent: Sep. 4, 2012

(54) CRYSTALLINE NOBLE METAL NANOSTRUCTURES AND METHODS FOR THEIR PREPARATION

(75) Inventors: Younan Xia, St. Louis, MO (US); Yujie Xiong, St. Louis, MO (US)

(73) Assignee: University of Washington, Seattle, WA (US)

( * ) Notice: Subject to any disclaimer, the term of this patent is extended or adjusted under 35 U.S.C. 154(b) by 497 days.

(21) Appl. No.: 12/397,168

(22) Filed: Mar. 3, 2009

(65) Prior Publication Data

US 2009/0297388 A1    Dec. 3, 2009

Related U.S. Application Data

(60) Provisional application No. 61/033,283, filed on Mar. 3, 2008.

(51) Int. Cl.
*B22F 9/04* (2006.01)
(52) U.S. Cl. .............................. 75/361; 75/370; 977/888
(58) Field of Classification Search .................. None
See application file for complete search history.

(56) References Cited

U.S. PATENT DOCUMENTS

| | | | |
|---|---|---|---|
| 2005/0217427 A1* | 10/2005 | Suthersan et al. | 75/362 |
| 2009/0325795 A1* | 12/2009 | Kamizono et al. | 502/339 |
| 2010/0092372 A1* | 4/2010 | Mirkin et al. | 423/491 |

OTHER PUBLICATIONS

Keul, H.A. et al., "Structural Evolution of Gold Nanorods during Controlled Secondary Growth", Langmuir, vol. 23, pp. 10307-10315, Published Aug. 22, 2007.*
Xiong, Y., and Y. Xia, "Shape-Controlled Synthesis of Metal Nanostructures: The Case of Palladium," Advanced Materials 19(20):3385-3391, Oct. 2007.
Xiong, Y., et al., "Synthesis and Characterization of Fivefold Twinned Nanorods and Right Bipyramids of Palladium," Chemical Physics Letters 440(4-6):273-278, Jun. 2007.
Xiong, Y., et al., "Synthesis and Mechanistic Study of Palladium Nanobars and Nanorods," Journal of the American Chemical Society 129(12):3665-3675, Mar. 2007.

* cited by examiner

*Primary Examiner* — George Wyszomierski
(74) *Attorney, Agent, or Firm* — Christensen O'Connor Johnson Kindness PLLC

(57) ABSTRACT

Crystalline noble metal nanostructures and methods for their preparation.

17 Claims, 33 Drawing Sheets

Metal precursor
reduction

{100} oxidative etching
atomic addition

{100}

Metal precursor

↓ reduction

↓ oxidative etching
atomic addition

Metal precursor reduction oxidative etching
atomic addition

—20 nm

—20 nm

CRYSTALLINE NOBLE METAL NANOSTRUCTURES AND METHODS FOR THEIR PREPARATION

CROSS-REFERENCE TO RELATED APPLICATION

This application claims the benefit of U.S. Patent Application No. 61/033,283, filed Mar. 3, 2008, expressly incorporated herein by reference in its entirety.

STATEMENT OF GOVERNMENT LICENSE RIGHTS

This invention was made with Government support under Contract No. DMR-0451788 awarded by the National Science Foundation. The Government has certain rights in the invention.

BACKGROUND OF THE INVENTION

Single-crystal, one-dimensional (1-D) nanostructures of palladium are attractive as interconnects for fabricating nanoscale electronic devices. For example, palladium can form reliable and reproducible ohmic contacts with carbon nanotubes (CNTs) because palladium has a relatively high work function and can easily wet the carbon surface. This capability allows one to elucidate the intrinsic properties of CNTs and to maximize the performance of CNT-based devices such as field-effect transistors (FETs). Another important property of Pd is its exceptional sensitivity toward hydrogen. To this end, polycrystalline, mesoscopic wires made of palladium have been utilized for resistance-based detection of hydrogen gas. However, polycrystalline wires containing gaps between adjacent grains often shrink alter initial exposure to hydrogen and may cause random, irreversible changes to the resistance of a sensing device. It should be possible to overcome this problem by switching to single-crystalline palladium nanowires with better controlled characteristics.

One of the simplest ways to generate 1-D nanostructures of metals is to confine their growth within a template. The nanoscale channels in alumina or polycarbonate membranes have been most commonly used for this purpose. Other types of templates include mesoporous silica, cylindrical micelles, and organic block copolymers, as well as the edges or grooves on solid substrates. Although a template-directed synthesis can be very simple and straightforward, it is limited in terms of the quantity of nanostructures that can be produced in each run of synthesis. It often yields polycrystalline nanostructures, which are less valuable for both fundamental study and device fabrication. In addition, the template needs to be removed in a post synthesis step so the metal nanostructures can be harvested and put to use. As a result, it seems to be impractical to rely on template-directed synthesis if one needs single-crystal, 1-D nanostructures of palladium.

Solution-phase growth has received considerable interest for its capability to produce single-crystal nanostructures with high quality. However, it is not easy to grow 1-D nanostructures of palladium in a solution phase. As a face-centered cubic (fcc) metal, palladium has no intrinsic driving force for the growth of anisotropic structures when the seeds are surrounded by an isotropic medium. As dictated by thermodynamics, palladium atoms are expected to nucleate and grow into cuboctahedrons (with a nearly spherical shape) enclosed by a mix of {111} and {100} facets to minimize the total surface energy. This prediction has recently been verified by experimental studies where 8-nm cuboctahedrons were obtained as the major product when a palladium precursor was reduced at a sufficiently fast rate to exclude any kinetic effect. In general, an fcc metal can only be forced to grow into anisotropic nanostructures through the kinetic control. As demonstrated in previous work, triangular and hexagonal thin plates of palladium could be prepared by operating at an extremely slow reduction rate to induce the formation of stacking faults and thus break the cubic symmetry. For such thin plates, the top and bottom faces account for greater than 70% of the surface and are terminated in {111} facets, while the side faces (less than 30% of the surface) are enclosed by {100} and {111} facets. It is evident that one needs to not only break the cubic symmetry but also substantially increase the coverage of {100} and/or {111} facets on the surface to generate nanostructures with 1-D.

A need exists for a solution phase method for forming anisotropic metal nanostructures. The present invention seeks to fulfill this need and provides further related advantages.

SUMMARY OF THE INVENTION

The present invention provides crystalline metal nanostructures and methods for their preparation.

In one aspect, the invention provides a method for making a crystalline anisotropic nanostructure. In one embodiment, the method includes:

(a) forming a metal seed crystal having a plurality of surfaces;

(b) adsorbing bromide to one or more surfaces of the seed crystal to provide a seed crystal having adsorbed bromide;

(c) reducing a metal precursor compound at a rate sufficient to add metal atoms to the seed crystal having adsorbed bromide; and (d) oxidatively etching one surface of the seed crystal having adsorbed bromide to break symmetry to promote growth of the seed crystal along an axis of the seed crystal to provide an anisotropic nanostructure.

In the method, the metal seed crystal can be selected from palladium, platinum, gold, and silver seed crystals. In one embodiment, the seed crystal has face-centered cubic (fcc) symmetry. The seed crystal can be a single crystal or a multiple twinned crystal.

The metal precursor compound can be selected from palladium, platinum, gold, and silver precursor compounds.

In the method, forming a seed crystal having a plurality of surfaces comprises reducing a metal precursor compound with a reducing agent.

In the method, adsorbing bromide to one or more surfaces of the seed crystal comprises treating the seed crystal with a bromide compound. In one embodiment, adsorbing bromide to one or more surfaces of the seed crystal comprises altering the order of free energies of the surfaces and to promote the formation of {100} and {110} facets.

In the method, oxidatively etching one surface of the seed crystal comprises removing bromide from a surface of the seed crystal by the action of an oxidizing agent. In one embodiment, oxidatively etching one surface of the seed crystal comprises breaking symmetry to promote growth of the seed crystal along an axis of the seed crystal to provide an anisotropic nanostructure having elongated {100} and {110} facets.

In one embodiment, the method further includes comprising adding a capping agent to the seed crystal. Representative capping agents include poly(vinylpyrrolidone).

The aspect ratios of the anisotropic nanostructures produced by the method can be from about 1.1 to about 20. In one embodiment, the anisotropic nanostructure is a palladium, platinum, or silver nanobar. In one embodiment, the anisotropic nanostructure is a palladium, gold, or silver nanorod. In one embodiment, the anisotropic nanostructure is a palladium, gold, or silver five-fold twinned nanorod.

The invention also provides nanostructures produced by the method.

In one aspect, the invention provides crystalline nanostructures.

In one embodiment, the crystalline metal nanostructure has a substantially square cross-section. In one embodiment, this nanostructure is a nanobar having an aspect ratio of from about 1.1 to about 5. In these embodiments, the crystalline nanostructure comprises a metal selected from the group consisting of palladium, platinum, and silver.

In another embodiment, the invention provides a crystalline palladium nanostructure having a substantially octagonal cross-section. In one embodiment, this nanostructure is a nanorod having an aspect ratio of from about 1.1 to about 20.

In a further embodiment, the invention provides a crystalline palladium nanostructure having a substantially pentagonal cross-section. In one embodiment, this nanostructure is a five-fold twinned nanorod having an aspect ratio of from about 1.1 to about 20.

DESCRIPTION OF THE DRAWINGS

The foregoing aspects and many of the attendant advantages of this invention will become more readily appreciated as the same become better understood by reference to the following detailed description, when taken in conjunction with the accompanying drawings.

FIGS. 17A and 17B are TEM images and 17C is a SEM image of a sample prepared in an aqueous solution containing 12 mM ascorbic acid and 0.45 M KBr. The syntheses was performed at 80° C., with the molar ratio of the repeating unit of PVP to Na$_2$PdCl$_4$ being 5. FIG. 17D is a high-resolution TEM image taken from the end of a five-fold twinned nanorod. The inset of FIG. 17B shows the blow-up TEM images of a single five-fold twinned nanorod. In FIG. 17B, a typical right bipyramid (RB), multiple twinned particle (MTP) and nanobar (bar) are indicated.

DETAILED DESCRIPTION OF THE INVENTION

Figure 1A:
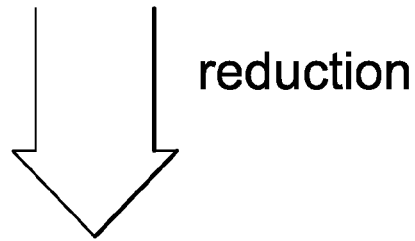
FIG. 1A is a schematic illustration of the formation of a nanobar in accordance with the method of the invention.
Figure 1A:
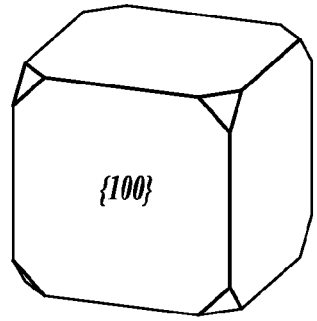
Figure 1A:
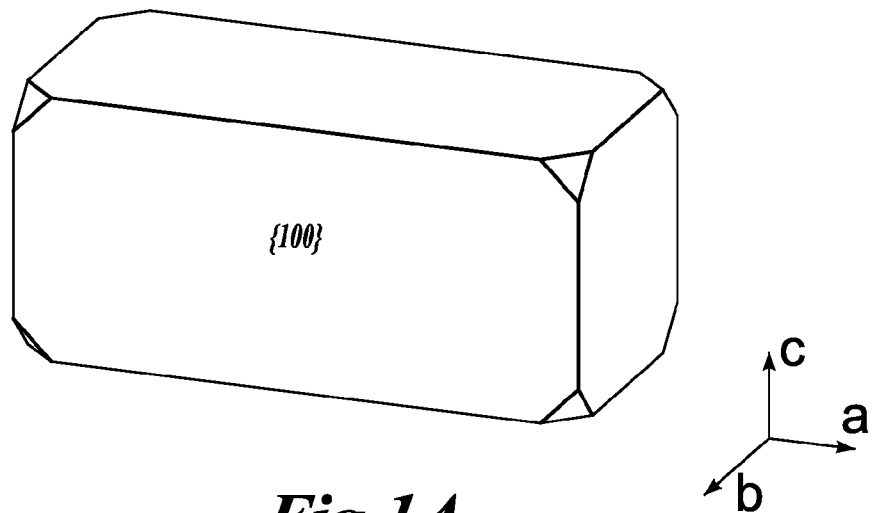

The present invention provides crystalline metal nanostructures and methods for their preparation. In one embodiment, the nanostructures are single-crystal noble metal nanostructures having high aspect ratios.

In one aspect, the present invention provides a simple and versatile method for growing highly anisotropic, single-crystal nanostructures of noble metals, including palladium, platinum, gold, and silver. In the method, the formation of {100} and {110} facets can be greatly promoted by introducing bromide into the reaction solution. Bromide is able to adsorb onto the surface of metal (e.g., palladium) seeds and alter the order of surface free energies for different facets. By the method of the invention, nanobars, structures with a square cross-section and enclosed by {100} facets, and nanorods, structures with an octagonal or pentagonal cross-section whose side surface is bounded by a mix of {100} and {110} facets, can be selectively formed.

The anisotropic growth is likely induced by localized oxidative etching on one specific face of a seed, creating an active site for atomic addition (i.e., growth) and facilitating preferential growth on this face. When the rate of atomic addition is sufficiently rapid, the preferential growth on this particular face leads to the formation of an elongated nanostructure with a square cross-section (i.e., a nanobar). When the reduction rate is in the medium region, the seeds take a cubic shape with slight truncation at the corners, and the product mainly contains nanobars. As the reduction rate becomes more rapid, more seeds are formed in the nucleation step: These cubic seeds are smaller in size, but with more significant truncation at the corners, and the product is dominated by nanorods thinner than the nanobars. Because the nanobars and nanorods are kinetically controlled products, they can be aged and transformed into cuboctahedrons, a shape more favorable from the viewpoint of thermodynamics. The method is useful for making palladium, gold, and platinum crystalline anisotropic nanostructures.

In one aspect, the invention provides a solution-phase method for making a crystalline anisotropic nanostructure. In one embodiment, the method includes a nucleation step (seed crystal formation), bromide adsorption, metal precursor reduction, and atomic addition (crystal growth).

In one embodiment, the methods includes the steps of
(a) forming a metal seed crystal having a plurality of surfaces;
(b) adsorbing bromide to one or more surfaces of the seed crystal to provide a seed crystal having adsorbed bromide;
(c) reducing a metal precursor compound at a rate sufficient to add metal atoms to the seed crystal having adsorbed bromide; and
(d) oxidatively etching one surface of the seed crystal having adsorbed bromide to break symmetry to promote growth of the seed crystal along an axis of the seed crystal to provide an anisotropic nanostructure.

In another embodiment, when a metal seed crystal is available, formation of the metal seed crystal in not necessary, and the method includes adsorbing bromide to one or more surfaces of a seed crystal to provide a seed crystal having adsorbed bromide.

As used herein, the term "anisotropic" refer to structures having aspect ratios (i.e., length/width) greater than 1.0. Anisotropic nanostructures formed by the method of the invention include nanobars, structures having a square cross-section, that are longer than wide (e.g., aspect ratios from about 1.1 to about 5), and nanorods, structures having an octagonal or pentagonal cross-section, that are longer than wide (e.g., aspect ratios from about 1.1 to about 20).

In the method, suitable metal seed crystals include palladium, platinum, gold, and silver seed crystals. The seed crystal has face-centered cubic (fcc) symmetry. Representative seed crystals include single crystals having, for example, a cube or cuboctahedron shape, and multiple twinned crystals having, for example, a decahedron shape. In the methods of the invention cube seed crystals can be grown into nanobars, cuboctahedron crystals can be grown into nanorods, and decahedron crystals can be grown into five-fold twinned nanorods.

In the method, the steps of forming a seed crystal having a plurality of surfaces and comprises reducing a metal precursor compound can include reaction of a metal precursor compound with a reducing agent to provide metal atoms that nucleate to form the seed crystal and add to the seed crystal, respectively. Suitable metal precursor compounds include metal compounds that include metal centers that can be reduced to provide metal atoms for addition to the seed crystal Metal precursor compounds include palladium, platinum, gold, and silver precursor compounds. Representative metal precursor compounds include $Na_2PdCl_4$, $Na_2PdBr_4$, $Pd(NO_3)_2$, $Na_2PtCl_6$, $K_2PtCl_6$, $H_2PtCl_6$, $HAuCl_4$, and $AgNO_3$.

Suitable reducing agents include reducing agents that rapidly or slowly reduce a metal ion (e.g., Pd, Pt, Au, or Ag ion) in solution to provide metal atoms. Representative reducing agents include ethylene glycol, di(ethylene glycol), ethanol, ascorbic acid, and citric acid.

In the method of the invention, bromide is adsorbed onto one or more faces of the seed crystal. In one embodiment, adsorbing bromide to one or more surfaces of the seed crystal comprises altering the order of free energies of the surfaces and to promote the formation of {100} and {110} facets. In the method, adsorbing bromide to one or more surfaces of the seed crystal comprises treating the seed crystal with a bromide compound. Suitable bromide compounds include any bromide compound that provides bromide for adsorbing onto the seed crystal surface, The bromide compound can be an inorganic bromide compound or an ionic organic bromide compound. Representative inorganic bromide compounds include potassium bromide and sodium bromide. Representative organic bromide compounds include organic ionic surfactants that include bromide, such as cetyl trimethylammonium bromide (CTAB), cetyltriphenylphosphonium bromide, dodecyldimethylammonium bromide, and dodecylmethylammonium bromide, among others.

It will be appreciated that when the metal precursor compound is itself bromide containing (e.g., $Na_2PdBr_4$) the further addition of a bromide compound may not be necessary. In this embodiment, the metal precursor compound is the source of bromide and no additional bromide compound is necessary.

Anisotropic growth of the seed crystal occurs when one surface of the seed crystal grows selectively. In one embodiment of the method, anisotropic growth occurs by oxidatively etching one surface of the seed crystal whereby symmetry of the crystal is broken to promote growth of the seed crystal along an axis of the seed crystal to provide an anisotropic nanostructure having elongated {100} and {110} facets. In one embodiment, oxidatively etching one surface of the seed crystal comprises removing bromide from a surface of the seed crystal by the action of an oxidizing agent. Suitable oxidizing agents include any oxidizing agent that removes bromide from a seed crystal surface. Representative oxidizing agents include oxygen (e.g., from air), chloride (e.g., from precursor compound), and water.

In one embodiment, the method of claim 1 further includes adding a capping agent to the seed crystal. A representative capping agent is a poly(vinylpyrrolidone).

The anisotropic nanostructures produced by the method of the invention have aspect ratios of from about 1.1 to about 20. In one embodiment, the anisotropic nanostructure is a palladium, platinum, or silver nanobar having a square or substantially square cross-section. In one embodiment, the anisotropic nanostructure is a palladium, gold, or silver nanorod having an octagonal or substantially octagonal cross-section. In another embodiment, the anisotropic nanostructure is a palladium, gold, or silver five-fold twinned nanorod having a pentagonal or substantially pentagonal cross-section.

In one embodiment of the invention, the solution-phase method for making anisotropic crystalline nanostructures includes using an ethylene glycol (ethylene glycol or di(ethylene glycol)) as a reducing agent and poly(vinylpyrrolidone) as a capping agent.

In one specific embodiment, the method includes preparing a first solution comprising a metal precursor compound and a bromide compound in water; preparing a second solution comprising a solution of poly(vinylpyrrolidone) in an ethylene glycol; and combining the first and second solutions (e.g., by adding the two solutions to an ethylene glycol), and heating as necessary to provide the metal nanostructure. It will be appreciated that, although specific solutions and combinations are noted above, there is no particular significance to the order of addition or combination and that each reaction component can be added to the reaction mixture either separately or in combination with one or more other reaction components.

Representative methods of the invention for the preparation of anisotropic nanostructures are provided in Examples 1-4.

In the method of the invention, including the specific embodiment described above, the molar ratio of metal to bromide is from about 1:4 to about 1:100; and the molar ratio of metal to the repeating unit of PVP is from about 1:5 to about 1:30 (in those methods that include PVP).

In the method of the invention, the metal precursor compound is reduced with a reducing agent to provide the seed crystal and for atomic addition to the seed crystal. At a first reduction rate ("medium range") the seed takes a cubic shape with slight truncation at the corners (facets {111}) and the product is a nanobar. At a second reduction rate ("fast range") more seeds are formed in the nucleation step and these cubic seeds are smaller with more significant truncation at the corners (facets {111}) and the product is dominated by nanorods thinner than the nanobars. It will be appreciated that the reduction rate can be controlled by varying the reaction conditions such as temperature (i.e., increasing the reaction temperature increases the reduction rate), reducing agent (i.e., the stronger the reducing agent the greater the reduction rate), and reactant concentration (i.e., increasing the concentration of the reactants, particularly increasing the concentration of the reducing agent relative to the metal precursor compound, increases the reduction rate). For example, a first reduction rate can be achieved in the reaction using 5 mL EG and 6 mL water and a second ("faster") rate can be achieved using 8 mL EG and 3 mL water (increasing reducing agent concentration increases reduction rate).

The invention provides crystalline noble metal nanostructures prepared by the methods described above.

In another aspect of the invention, crystalline noble metal nanostructures are provided.

In one embodiment, the invention provides a crystalline metal nanostructure having a square or substantially square cross-section. See FIG. 1A. The nanostructure is a nanobar having a square cross-section enclosed by {100} facets. The nanostructure has an aspect ratio of from about 1.1 to about 5. The preparation of representative nanobars of the invention are described in Examples 2 and 3.

In another embodiment, the invention provides a crystalline metal nanostructure having an octagonal or substantially octagonal cross-section. See FIG. 1B. The nanostructure is a nanorod having an octagonal cross-section having side surfaces enclosed by a combination of {100} and {110} facets. The nanostructure has an aspect ratio of from about 1.1 to about 20. The preparation of representative nanorods of the invention is described in Example 1.

In a further embodiment, the invention provides a crystalline metal nanostructure having a pentagonal or substantially pentagonal cross-section. See FIG. 1C. The nanostructure is a nanorod having an pentagonal cross-section. The nanostructure has an aspect ratio of from about 1.1 to about 20. The preparation of representative nanorods of the invention having pentagonal cross-sections is described in Example 4.

The following description directed to methods for making palladium nanostructures, further exemplifies the method and nanostructures of the invention, which are applicable to methods for making other noble metal nanostructures such as platinum, gold, and silver nanostructures.

Correlation between Nanostructure Shape and Reduction Kinetics. Syntheses were conducted in solutions that contained KBr, polyvinylpyrrolidone (PVP), and different amounts of ethylene glycol (EG) in water, with the addition of $Na_2PdCl_4$ as a precursor to Pd atoms. The key reaction involved in such a synthesis is the co-reduction of $Na_2PdCl_4$ by both EG and PVP. PVP's terminal hydroxyl groups can serve as a mild reducing agent for the generation of metal nanoparticles. In contrast to the weak reducing strength of PVP, EG has proven to be a more powerful reducing agent for the reduction of a metal salt. Therefore, in one embodiment of the method, the reduction rate should increase as the percent of EG in the solvent mixture is increased. Through this kinetic control, the reaction can generate a number of well-defined nanostructures (e.g., nanobars and nanorods) with different aspect ratios (RAs). FIGS. 2A-2D show TEM images of four representative samples, illustrating the dependence of the shape of Pd nanostructures on the concentration of EG. It is clear that reduction rates favored the formation of Pd nanobars (width, about 8 nm; RA, 1-1.2), nanobars (width, about 6 nm; RA, 2-4), and nanorods (diameter, about 2 nm; RA, about 8), respectively. For nanobars and nanorods, the yield was typically greater than 95% in each run of synthesis (see FIGS. 2A and 2D). This strong dependence implies that the shape of product can be effectively altered by manipulating the reduction rate. This point is further supported by the result of a synthesis where di(ethylene glycol) (DEG) instead of EG was used as the reductant. As compared to EG, DEG has a weaker reducing power and therefore shows a slower reduction rate for the Pd precursor. As a result, the reaction yielded short nanobars instead of nanorods (see FIG. 2E). In addition to the change of reducing agent, the reduction kinetics can also be manipulated by adjusting reaction temperature. To this end, the reduction was found to be accelerated to induce anisotropic growth by increasing the temperature from 100 to 120° C. while other parameters were kept the same as in FIG. 2D. This increase in temperature doubled the aspect ratio of Pd nanorods from 8 to 16 while the diameter remained at 2 nm (see FIG. 2F).

Figure 3A:
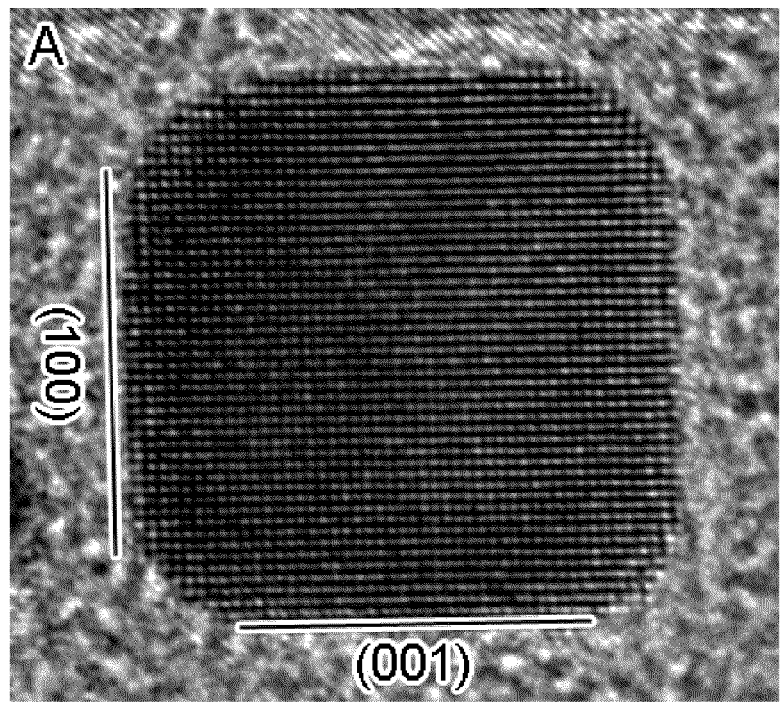
FIGS. 3A-3D are high-resolution TEM images of the Pd nanobars and nanorods shown in FIGS. 2A, 2B, and 2F: (A) a nanobar with an aspect ratio of about 1 recorded a nanorod recorded along [010]; (B) a nanobar with an aspect ratio of about 2 recorded along [010]; (C) along [1$\bar{1}$0]; and (D) a nanorod recorded along [010].
Figure 3B:
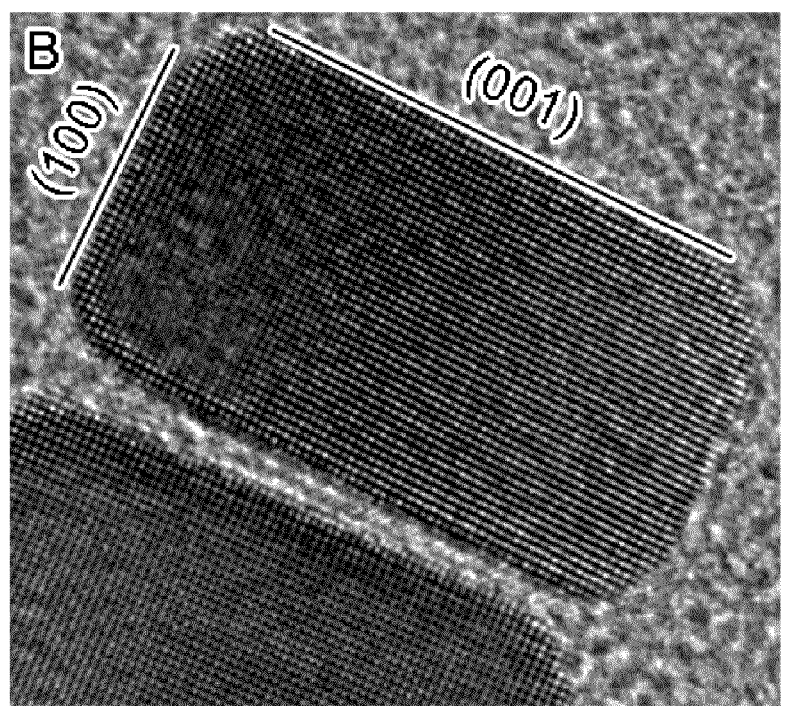
Figure 3C:
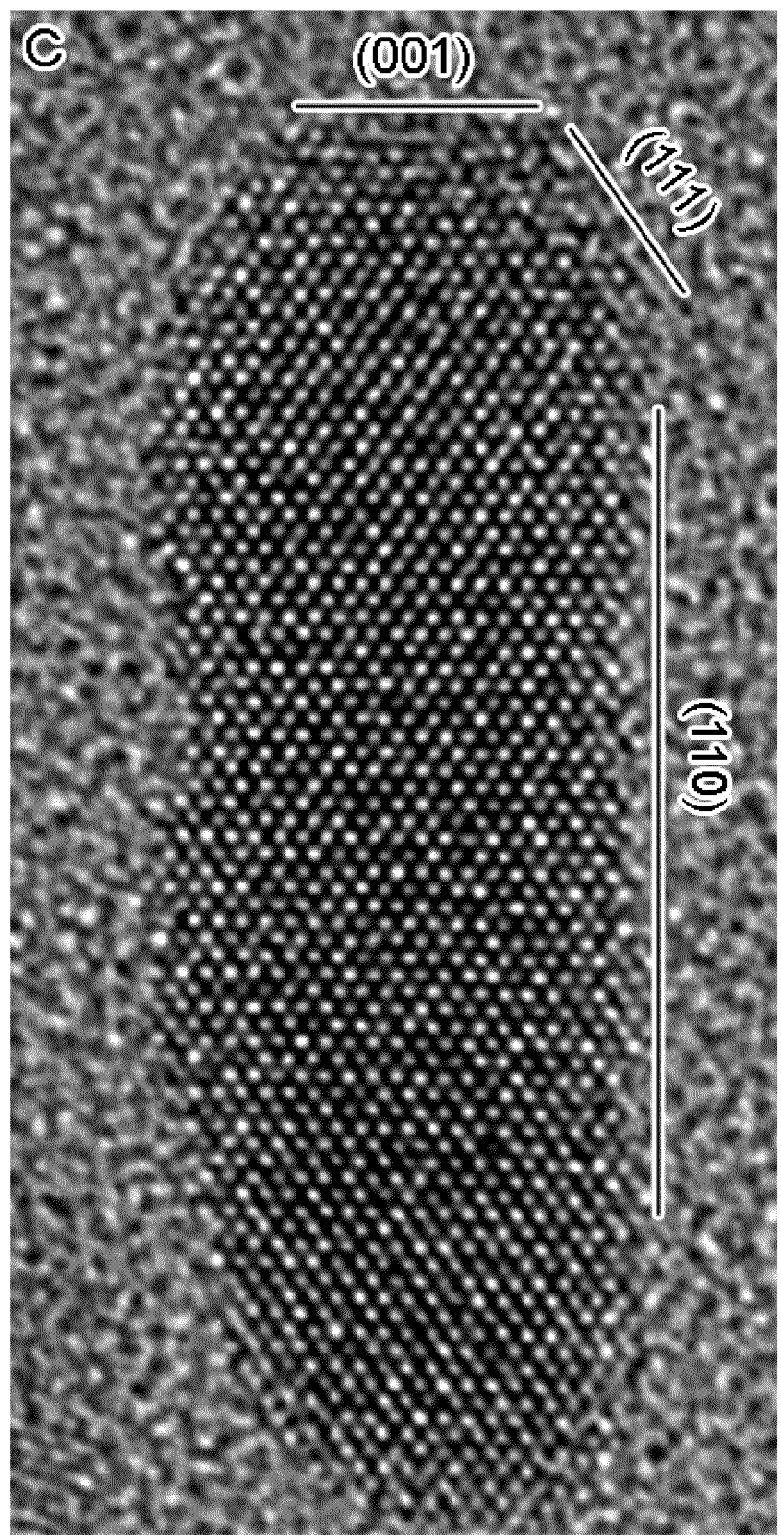
Figure 3D:
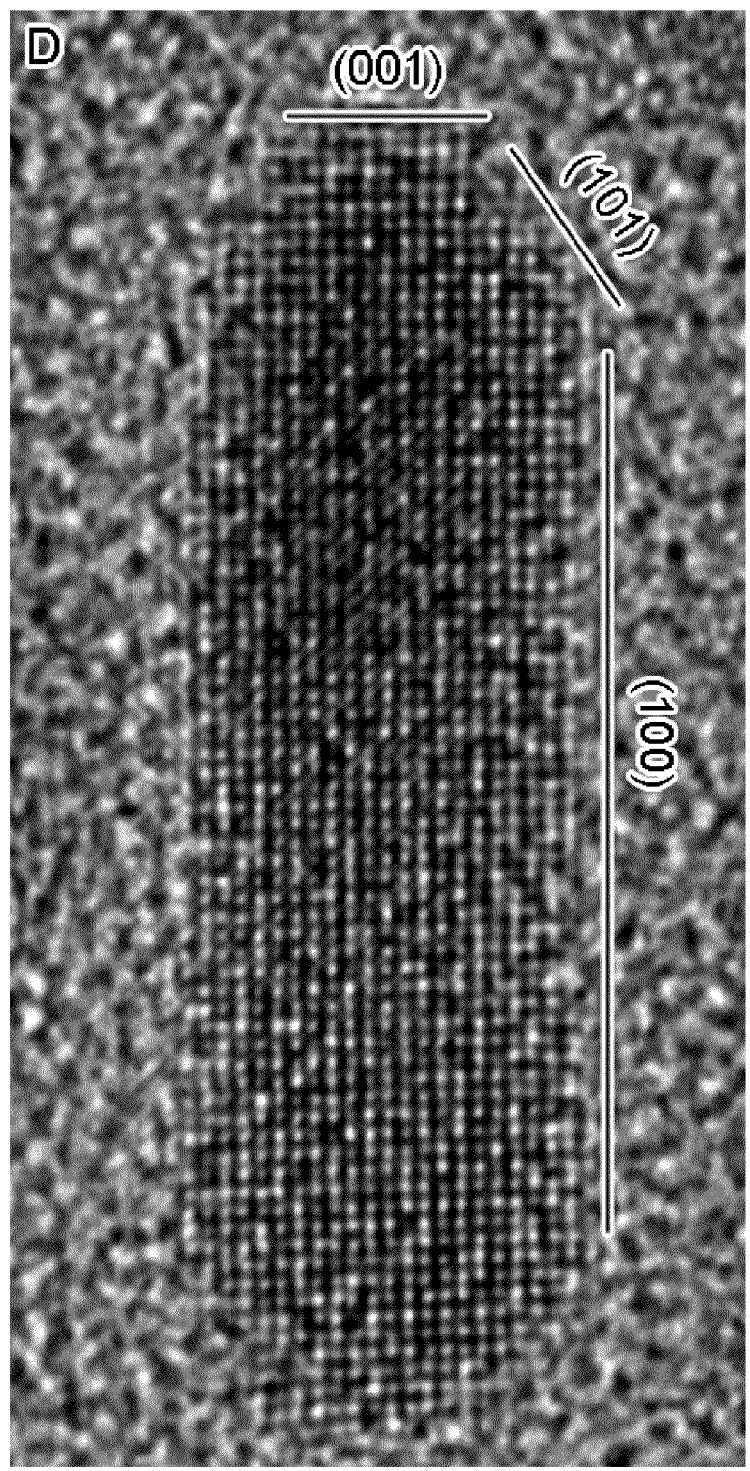

The structures of nanobars and nanorods were characterized by high-resolution TEM studies, as detailed in FIGS. 3A-3D and FIGS. 4A-4D. FIG. 3A shows a high-resolution TEM image of a nanocube with an aspect ratio of about 1. The fringes show a period of 2.0 Å, which was consistent with the {200} lattice spacing of fcc Pd. This image also displayed well-resolved, continuous fringes with the same orientation, implying that the Pd nanocube is a piece of single crystal bounded by {100} facets. Similarly, the Pd nanobar with a higher aspect ratio is also a single crystal enclosed by {100} facets, except that its dimension along one direction is much larger than those along the other two directions (see FIG. 3B). All were slightly truncated at the corners. Different from the nanobar, the nanorod has an octagonal cross-section and its side surface is hounded by a mix of both {100} and {110} facets. It can lie on a flat surface against any one of these facets. FIG. 3C shows a high-resolution TEM image of a Pd nanorod recorded along [1$\bar{1}$0], suggesting that the nanorod is a single crystal without any dislocation, stacking fault, or twin defects. This nanorod grew along the [001] direction and was supported on the TEM grid against one of its {110} facets. The ends of this nanorod were enclosed by the (001) face and {111} facets. FIG. 3D shows a high-resolution TEM image of a nanorod that lies on the TEM grid against the (010) face. The ends of this nanorod were enclosed by the (001) face and {110} facets of relatively small in area. These results are similar to the experimental observations on single-crystal Au nanorods. Surface reconstruction was also observed for the less stable {110} facets, which has a higher surface energy relative to the {100} and {111} facets. In sonic regions, rows of atoms are missing along the [1$\bar{1}$0] axis, and the {110} surface was transformed into strips of {111} facets. It is known that the {111} surface has a most closely packed structure, and thus the lowest surface energy. Through this surface reconstruction, the {110} facets were stabilized on the Pd nanorods. A similar surface reconstruction has also been observed for single-crystal Au nanorods. In addition to the high-resolution TEM, the nanorods and nanobars can also be easily distinguished by the sharpness of their ends, with bars, in general, sharper than rods.

Figure 5:
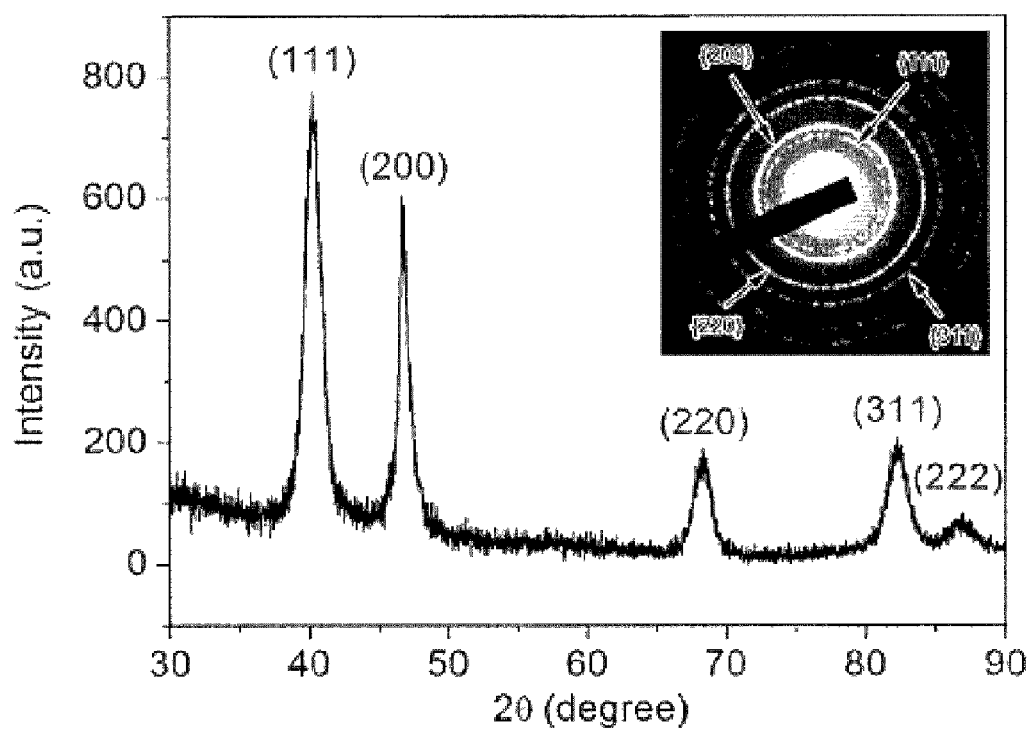
FIG. 5 is the XRD pattern taken from Pd nanobars shown in FIG. 2B. All the peaks can be indexed to fcc palladium (JCPDS card, 05-0681). No peaks were observed for impurities such as $PdBr_2$ and PdO. The ratio between the intensities of (111) and (200) peaks is much lower than the value reported for a conventional powder sample (1.33 versus 2.38), indicating that the diffraction from {100} planes is enhanced for the sample of nanobars. It is likely that the nanobars preferentially lay on the substrate against their flat {100} facets. As a result, there was a texturing effect. The ED pattern (inset) taken from an assembly of Pd nanobars also indicate that they were highly crystalline. The rings can be indexed to the diffraction from {111}, {200}, {220} and {311} planes of fcc palladium, respectively.

The phase purity and high crystallinity of the Pd nanostructures are also supported by powder X-ray diffraction (XRD). FIG. 5 shows the typical PXRD pattern of an as-prepared sample of Pd nanobars. In the XRD pattern, all of the peaks can be indexed to fcc palladium (JCPDS card, 05-0681). No characteristic peaks were observed for impurities such as $PdBr_2$ and PdO. The ratio between the intensities of (111) and (200) peaks is much lower than the value reported for the conventional powder sample (1.33 versus 2.38), indicating that the diffraction from {100} planes is enhanced for the sample of Pd nanobars. It is likely that the nanobars preferentially lay on the substrate against their flat {100} facets. As a result, there was a texturing effect. The ED pattern (inset of FIG. 5) taken from an assembly of Pd nanobars also indicates that they were highly crystalline. The concentric rings can be indexed to the diffraction from {111}, {200}, {220}, and {311} planes of fcc palladium, respectively.

Oxidative Etching and Its Role in the Anisotropic Growth of Nanostructures. Two mechanisms have been proposed to account for the anisotropic growth of a crystal in the solution phase when no template is involved. In the first mechanism, the solid materials are characterized by a highly anisotropic crystallographic structure, and they naturally grow into nanorods and nanowires. Typical examples include trigonal Se and Te, as well as würtzite CdS and CdSe. The second mechanism involves twin or stacking faults, which has been observed for both 5-fold twinned nanorods and 2-fold twinned nanobeams of fcc metals. The twin planes can generate re-entrant grooves, favorable sites for the addition of atoms. The absence of an anisotropic crystal structure or twin defects in both Pd nanobars and nanorods leads to a third mechanism, in which localized oxidative etching plays the pivotal role to induce anisotropic growth in a short period of time.

Oxidative etching can be used to slow a reduction process, selectively remove multiply twinned seeds, generate hollow Pd nanostructures, or shorten single-crystal Au nanorods. Oxidative etching can play another role in the formation of highly anisotropic nanostructures. In the present methods, addition of bromide at a sufficiently high concentration covers the surface of a nanocrystal (e.g., Pd) with bromide due to its strong binding to the surface. The adsorbed bromide layer prevents further addition of Pd atoms from solution to the nanocrystal surface, so one has to activate the surface of this nanocrystal to continue the growth. Oxidative etching (e.g., caused by oxygen from air or chloride from $PdCl_4^{2-}$), could remove some of the bromide from the surface and thus expose sites for addition of Pd atoms. The bromide layer makes it difficult to perform oxidative etching over the entire surface.

However, with the assistance of water, oxidative etching was able to occur locally on a specific face of a cubic nanocrystal. Corrosion of Pd nanocubes, whose surface was protected by a high concentration of PVP, occurs from only one side by a pitting process, even though all sides are equivalent {100} facets. In the galvanic replacement between Ag nanocubes and $HAuCl_4$ in water, it was also observed that etched pits were only formed at one of the six {100} faces. Oxidative etching can selectively take place on {100} tips of single-crystal Au nanorods, although there are other {100} faces on the side surface. This localized oxidative etching makes one face become more active than others and thus provides favorable sites for the addition of Pd atoms. When sufficient Pd atoms are added to the etched sites, atomic addition will be faster than the dissolution of atoms caused by etching. Preferential growth at these active sites that breaks the cubic symmetry of a Pd nanocrystal and leads to the formation of Pd nanorods and nanobars.

Figure 6A:
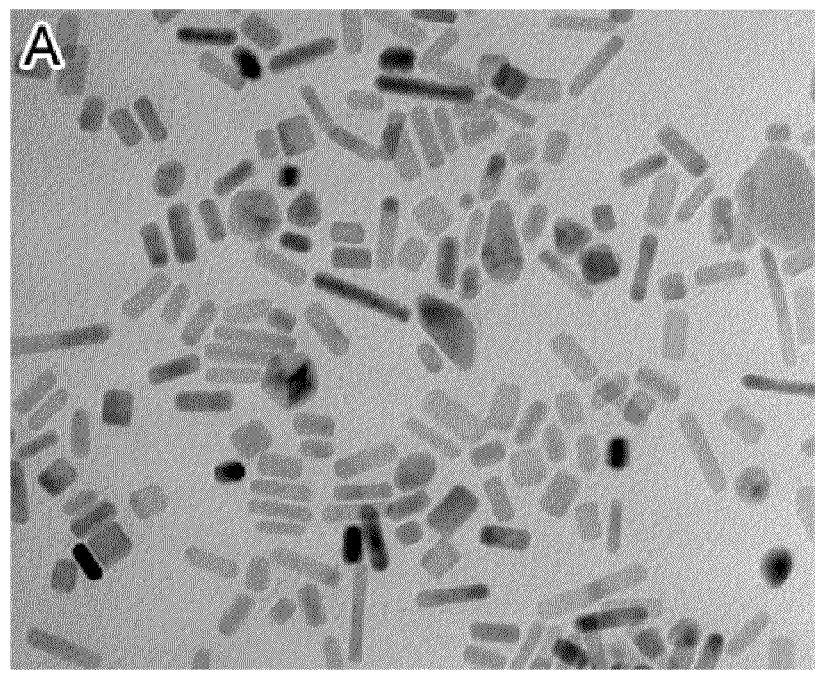
FIGS. 6A-6D are TEM images of Pd nanostructures synthesized when oxidative etching was retarded (A) by bubbling with Ar gas and (B) in the presence of 0.13 M citric acid; or enhanced (C) in the presence of 0.20 M NaCl and (D) 1 M HCl. All of the syntheses were carried out under the same condition as in FIG. 2D, except for the difference noted above.
Figure 6B:
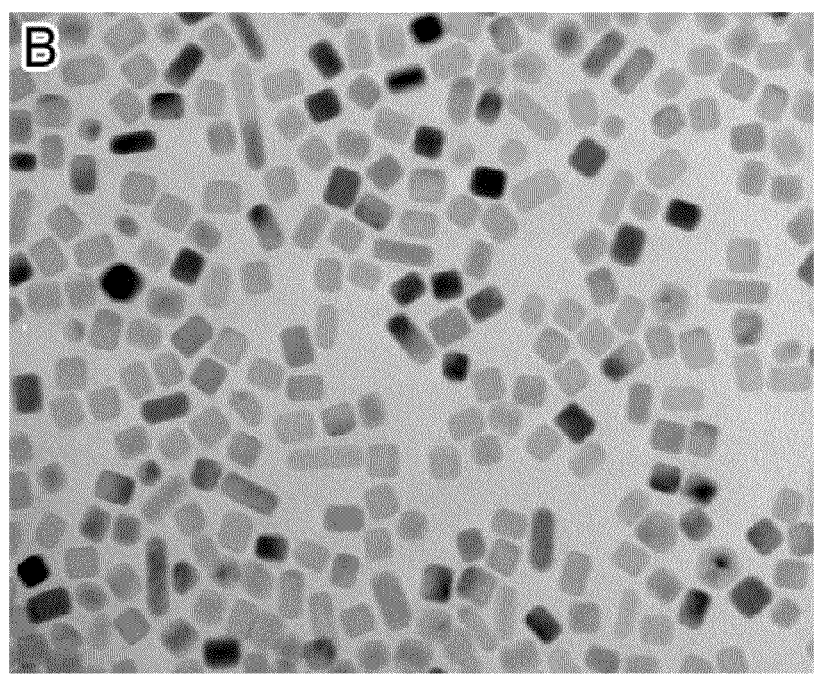
Figure 6C:
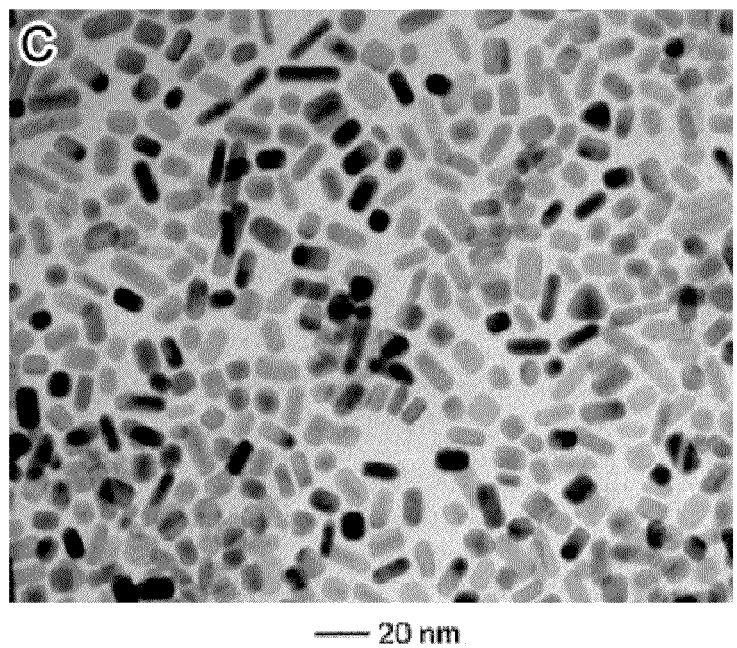
Figure 6D:
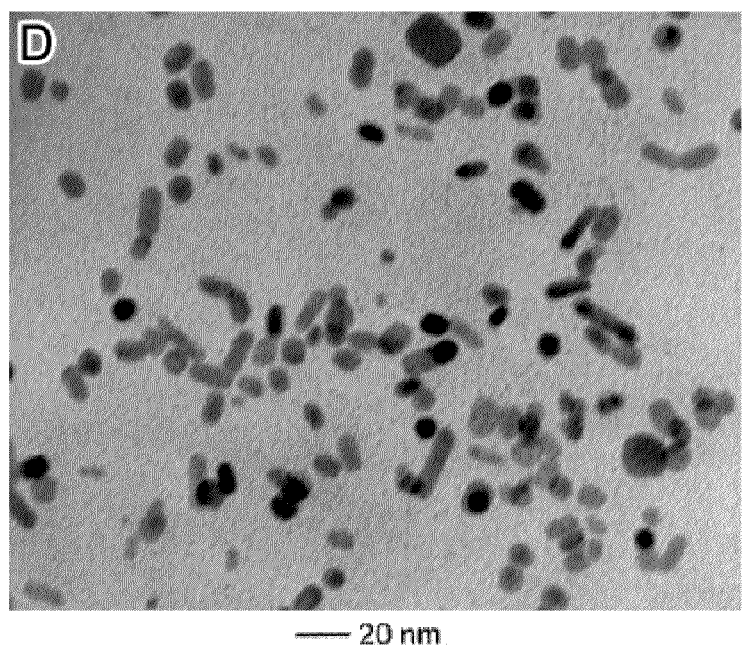

FIG. 6A shows a TEM image of the product obtained from a synthesis that was protected by continuous Ar flow. The resultant nanorods exhibited a decrease in aspect ratio as compared to the product prepared in air because oxidative etching was partially blocked due to the reduced level of air in the solution. However, because oxygen binds strongly to Pd surface, it is impossible to completely block oxidative etching in a Pd synthesis by simply bubbling an inert gas through the reaction solution. Addition of citric acid has been shown to efficiently block oxidative etching. When citric acid was included in the synthesis the product was found to contain nanocubes and short nanobars instead of nanorods (see FIG. 6B). This observation indicates that the lack of oxidative etching inhibited the anisotropic growth of nanocrystals. On the other extreme, when oxidative etching was enhanced, etching would take place over the entire surface of each particle rather than locally on a specific face, in a way to eliminate the difference between different faces. When NaCl was added to the reaction system to enhance oxidative etching, a decrease in aspect ratio for the nanostructures as shown in FIG. 6C. The oxidative etching could be further enhanced by adding HCl instead of NaCl. FIG. 6D shows a typical TEM image of the sample prepared with the use of HCl. The aspect ratio of Pd nanostructures was further reduced to 1-3, as compared to FIGS. 2D and 6C. From these results, it can be concluded that localized oxidative etching is responsible for the anisotropic growth of Pd nanobars and nanorods.

Adsorption of Bromide on the Surface of Nanostructures. In the methods of the invention, bromide plays a role in the formation of nanostructures enclosed by the {100} and {110} side facets. According to the Wulff construction, the thermodynamically favored shape of an fcc metal is cuboctahedron under the vacuum condition. In a solution-phase process, impurities or capping agents can alter the surface free energies via adsorption and thus induce new shapes. For instance, the {100} facets of an fcc metal can be stabilized through chemical interactions with the oxygen and/or nitrogen atoms of the pyrrolidone units of PVP, leading to the formation of truncated Pd nanocubes greater than 25 nm in size. However, a polymer is too large to have a capping effect on smaller nanocrystals. As a result, the PVP-stabilized Pd nanoparticles less than 10 nm in size usually have a cuboctahedral shape. When bromide was introduced into the reaction system, it is able to adsorb onto the surface of Pd seeds and alters the order of surface free energies. This modification to surface energy also plays an important role in facilitating the formation of anisotropic Pd nanostructures such as nanobars and nanorods that are enclosed by {100} and {110) side facets.

Figure 2A:
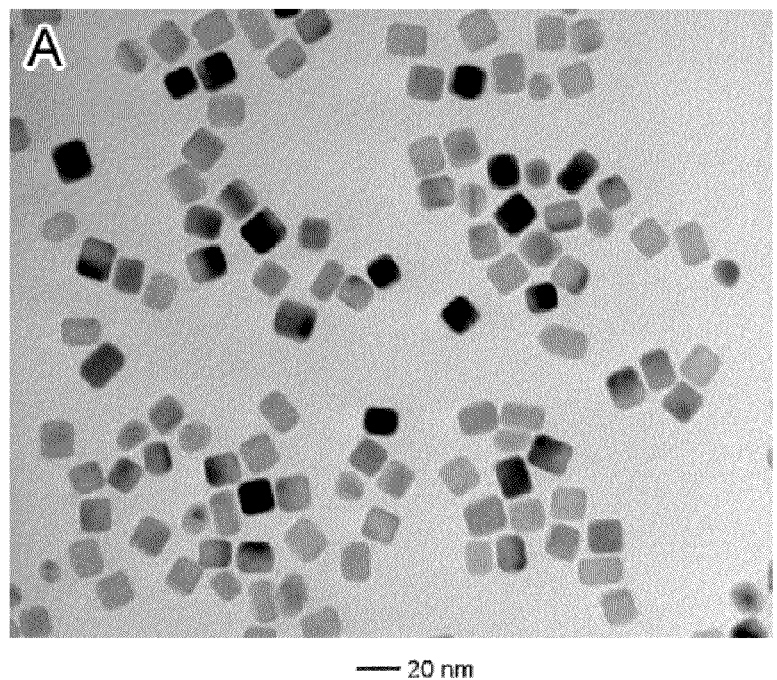
FIGS. 2A-2F are TEM images of Pd nanostructures that were obtained when the reduction kinetics was controlled by adjusting the volume percent of ethylene glycol (EG) in the solvent mixture: (A) 0%; (B) 9.1%; (C) 45.5%; and (D) 72.7%. The reaction temperature was 100° C. The product shown in (E) was obtained under the same condition as in (D), except for the use of di(ethylene glycol) (DEG) instead of EG. The product shown in (F) was obtained under the same condition as in (D), except that the temperature was increased to 120° C. All of these syntheses were carried out with a fixed molar ratio of KBr to $Na_2PdCl_4$ at 30, in the presence of 75 mM PVP, and in an 11-mL mixture of EG (or DEG) and water.
Figure 2B:
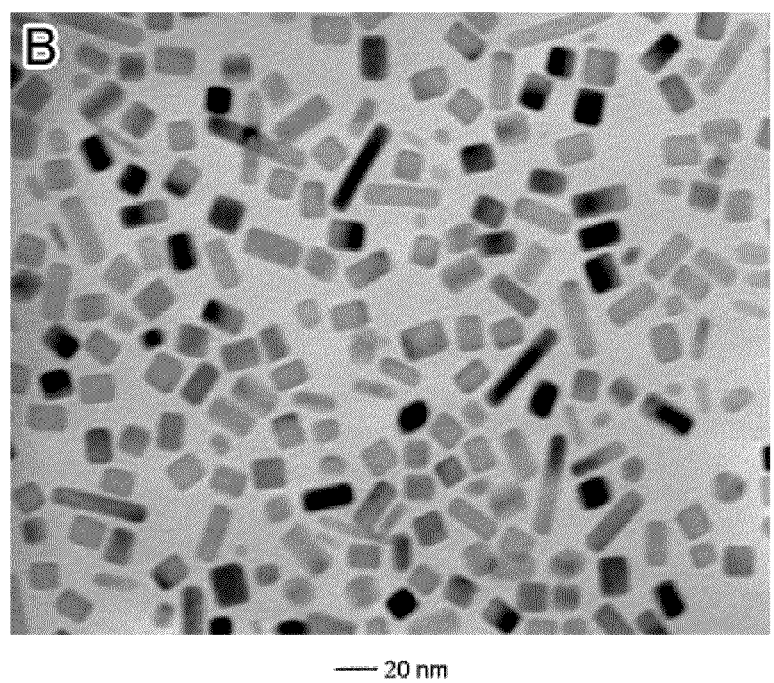
Figure 2C:
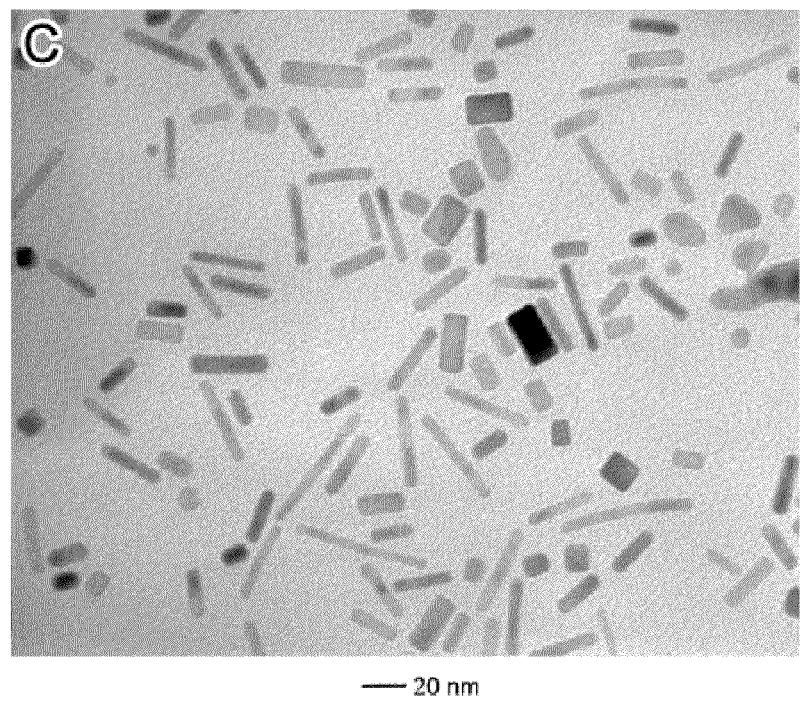
Figure 2D:
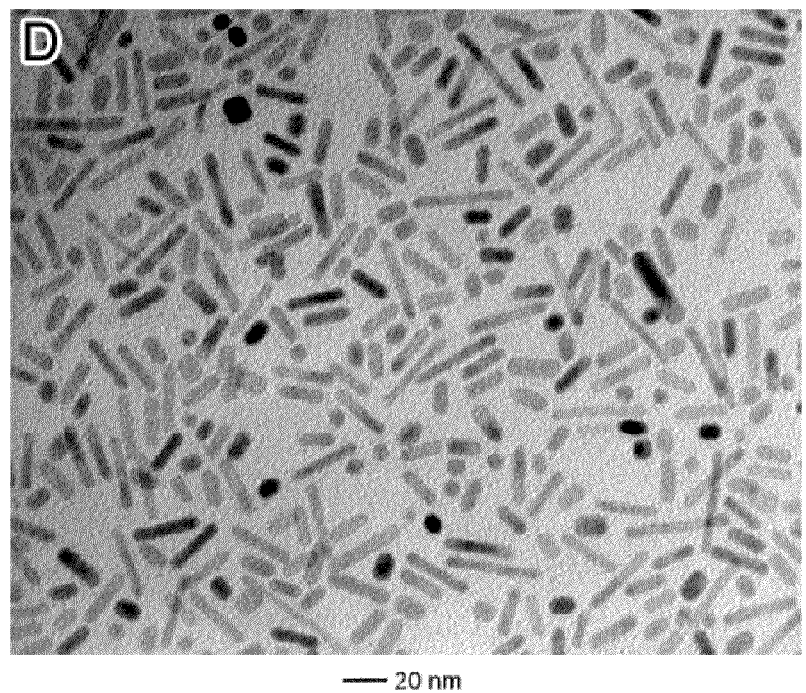
Figure 2E:
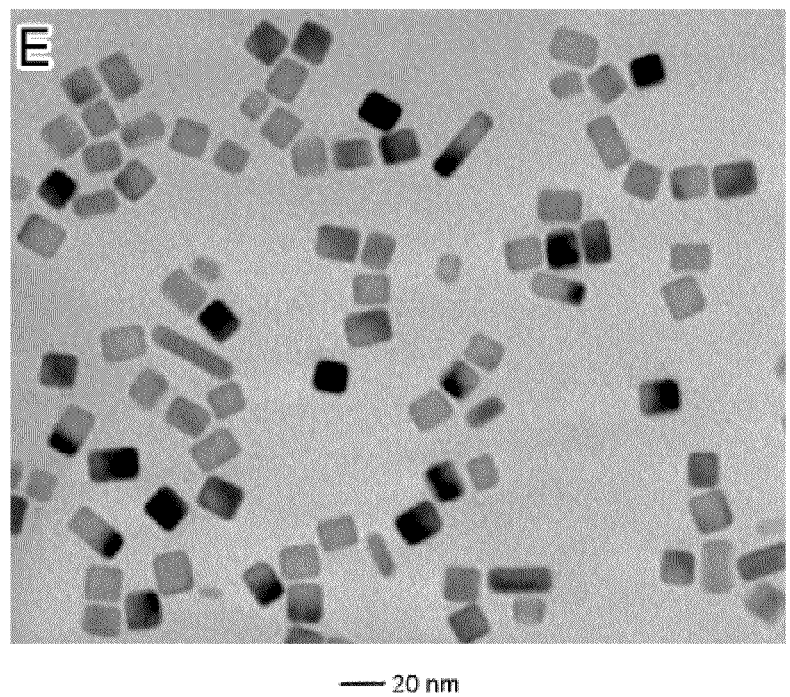
Figure 2F:
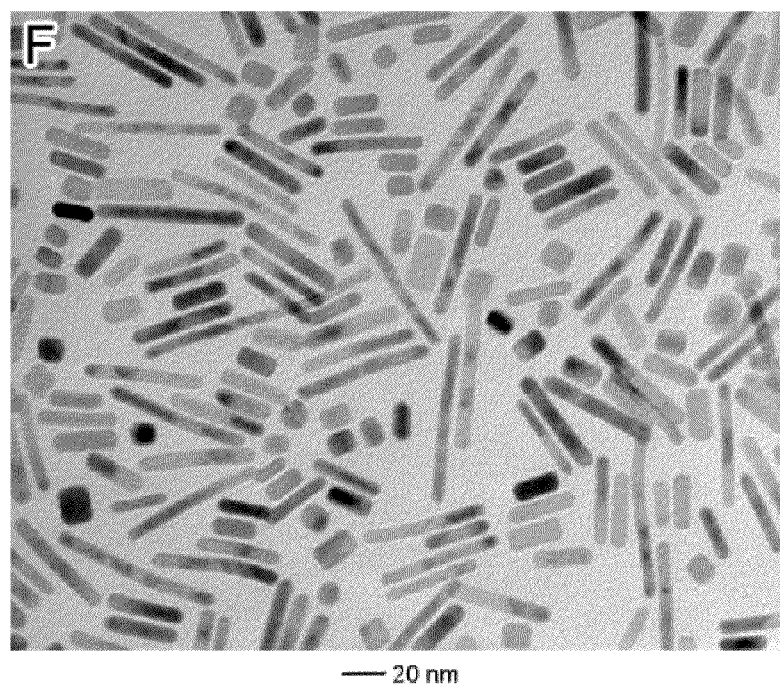
Figure 4A:
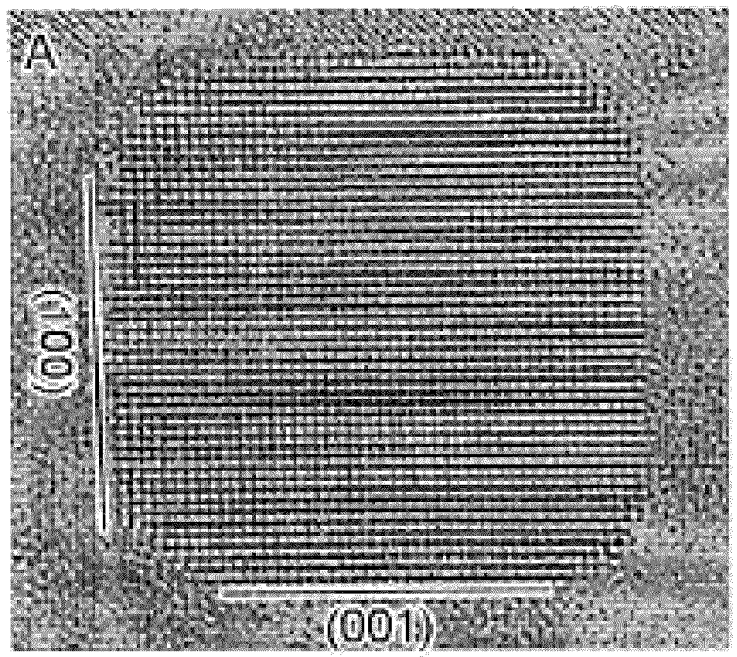
FIGS. 4A-4D are high-resolution TEM images that were obtained by filtering the images in FIG. 2 with a Gatan Digital Micrograph program: (A) a nanobar with an aspect ratio of about 1 recorded along [010] axis; (B) a nanobar with an aspect ratio of about 2 recorded along [010] axis; (C) a nanorod recorded along [1$\bar{1}$0] axis; and (D) a nanorod recorded along [010] axis.
Figure 4B:
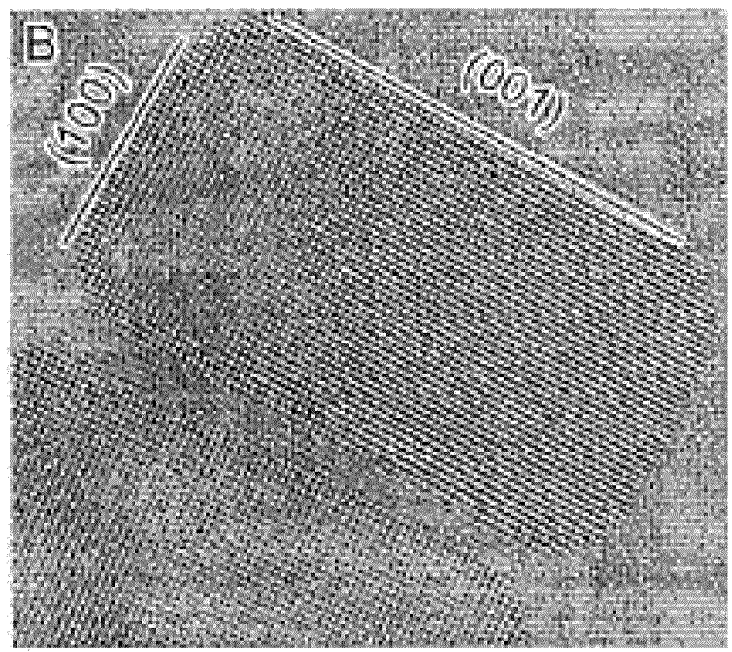
Figure 4C:
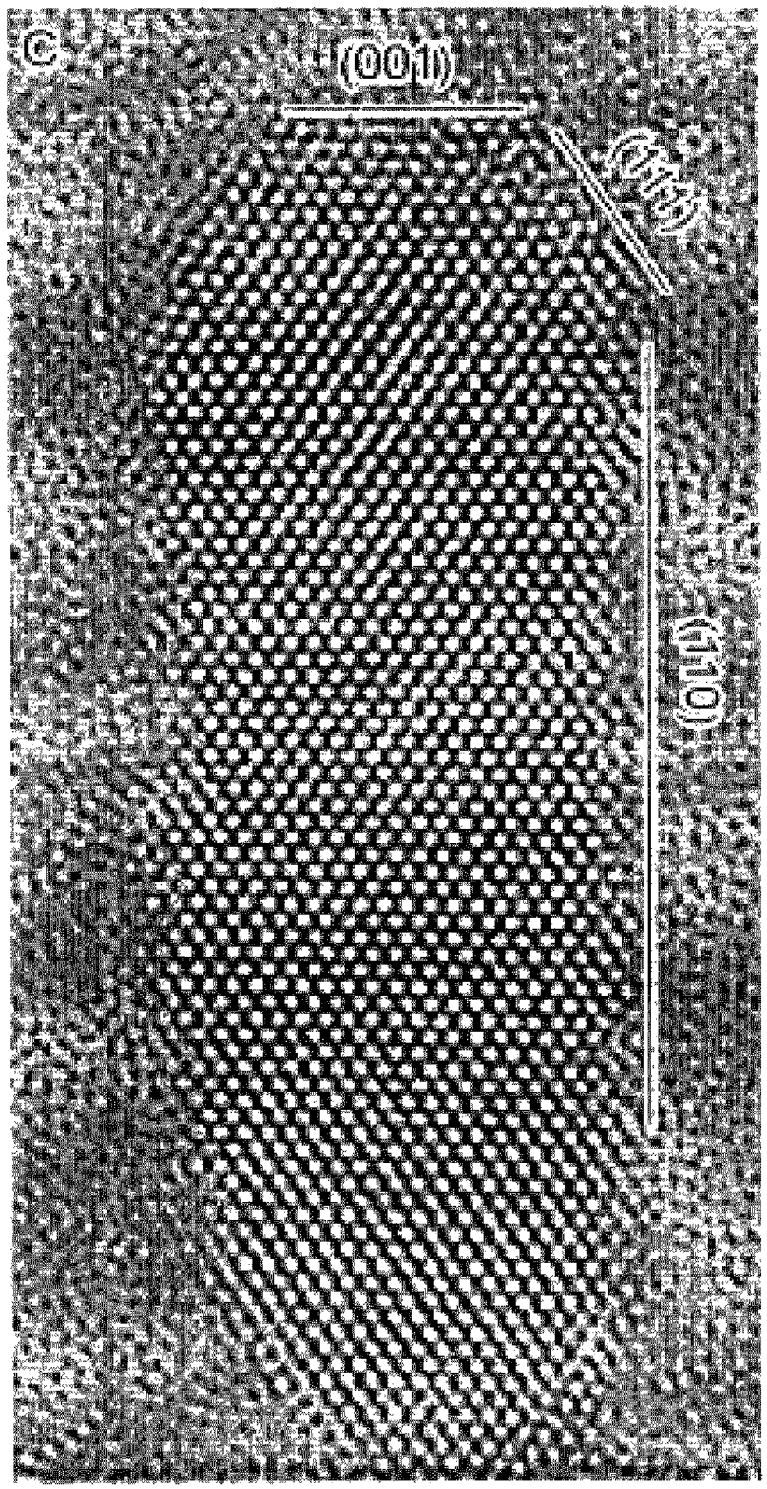
Figure 4D:
Figure 7A:
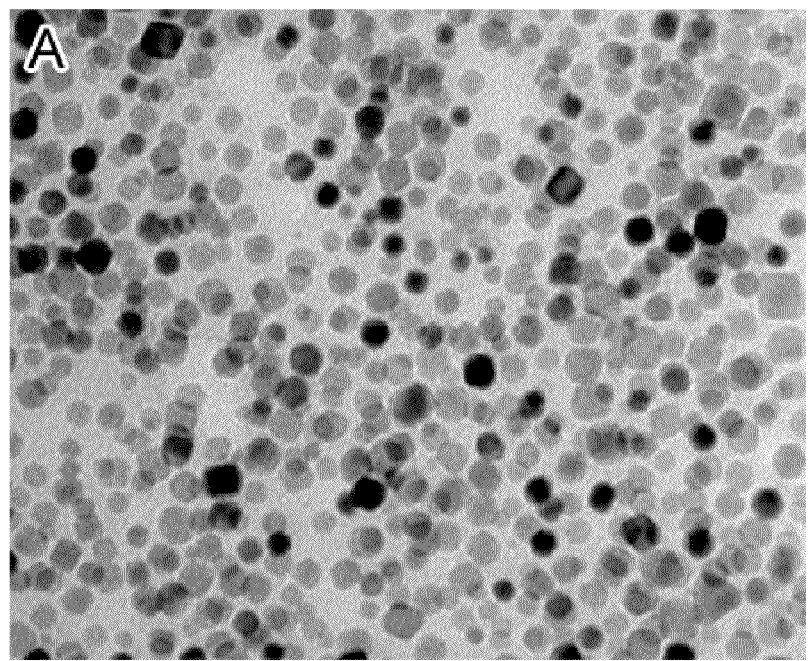
FIGS. 7A-7D are TEM images of Pd nanostructures synthesized in the presence of KBr at different concentrations, demonstrating the role of bromide in promoting {100} and {110} surfaces. The molar ratio of KBr to $Na_2PdCl_4$ was (A) 0; (B) 8; (C) 15; and (D) 50. All of the syntheses were carried out under the same condition as in FIG. 2D, except the variation of KBr concentration.
Figure 7B:
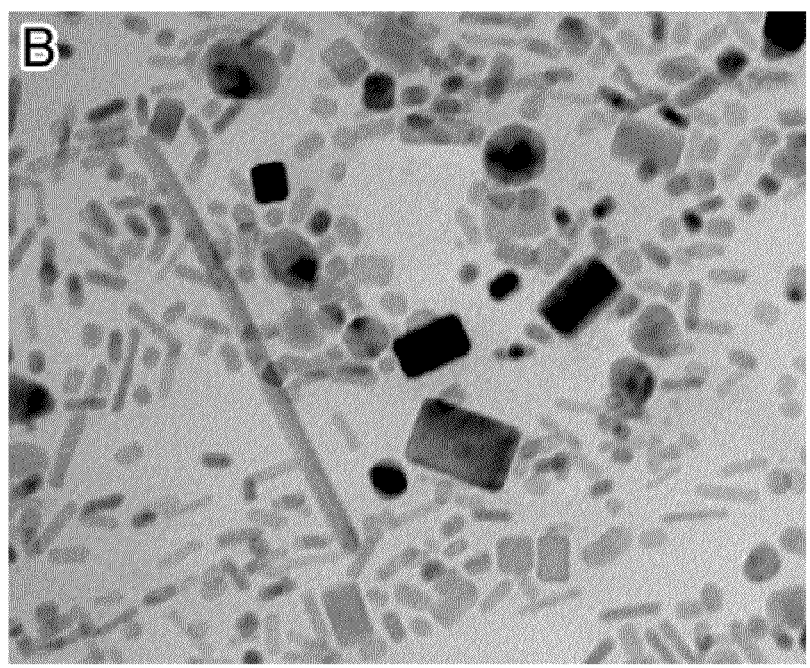
Figure 7C:
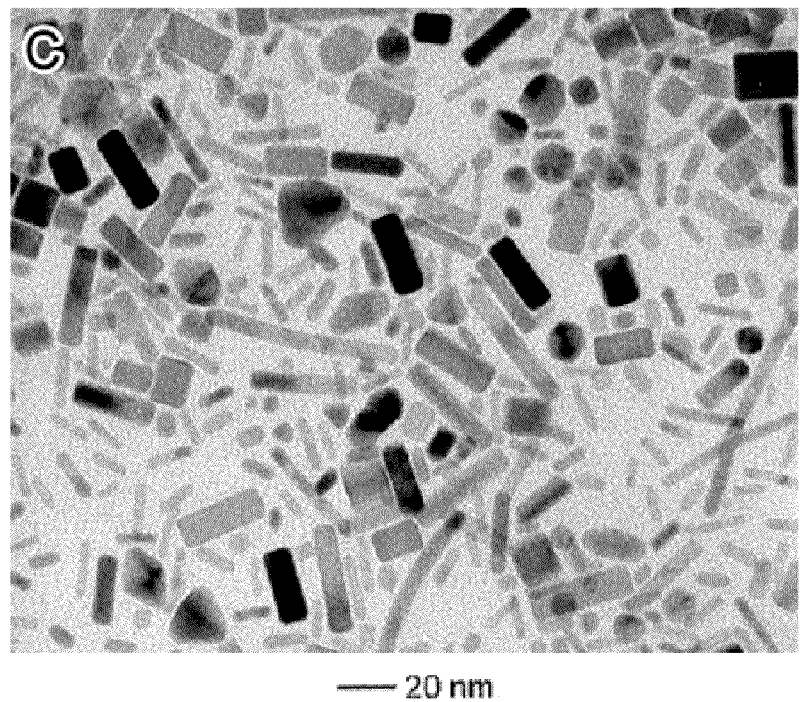
Figure 7D:
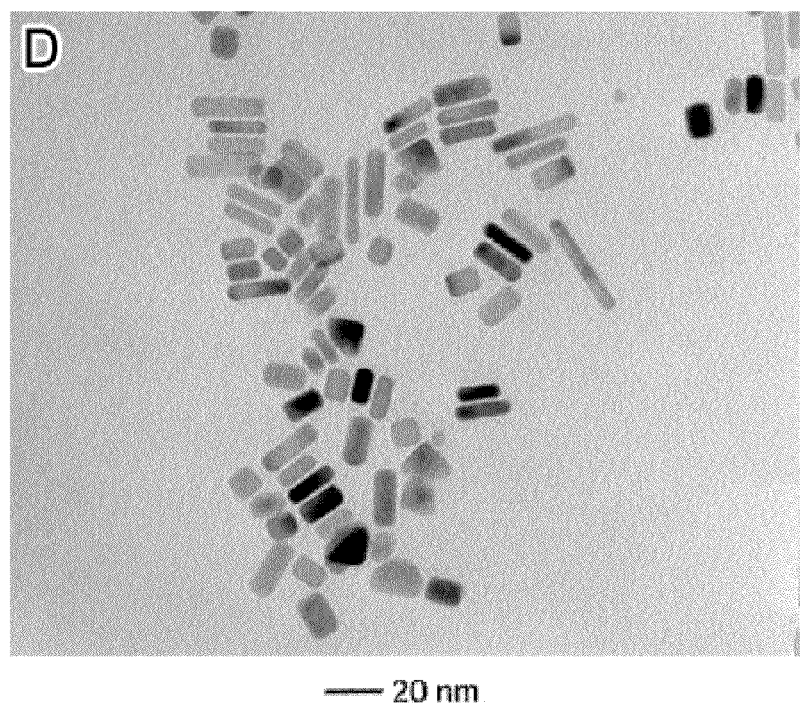
Figure 8A:
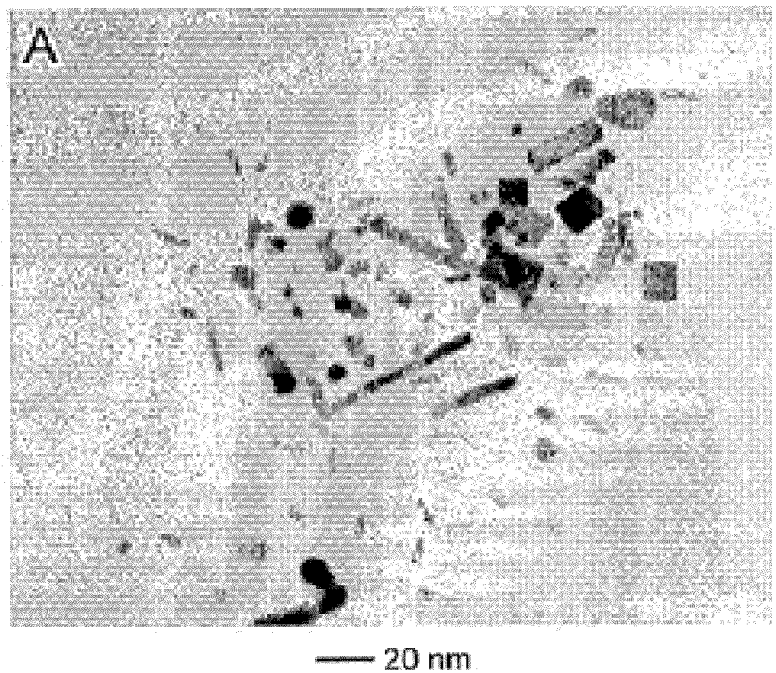
FIGS. 8A-8D are TEM images of Pd nanoparticles obtained with precursor $Na_2PdBr_4$ in the presence of KBr at different concentrations. The molar ratio of KBr to $Na_2PdBr_4$ was: (A) 8; (B) 15; (C) 30; and (D) 50. All the syntheses were conducted with 72.7% EG in an 11-mL mixture of EG and water at 100° C., and in the presence of 75 mM PVP. These parameters were the same as those in FIG. 7, except the use of $Na_2PdBr_4$ instead of $Na_2PdCl_4$ as a precursor compound. The morphology exhibited a similar dependence on the concentration of KBr. As compared to the case with $Na_2PdCl_4$ as a precursor, the samples prepared with $Na_2PdBr_4$ had lower aspect ratios. This difference can be attributed to the fact that oxidative etching became weaker in the absence of chloride, and thus it is more difficult to activate the surface of nanocrystals.
Figure 8B:
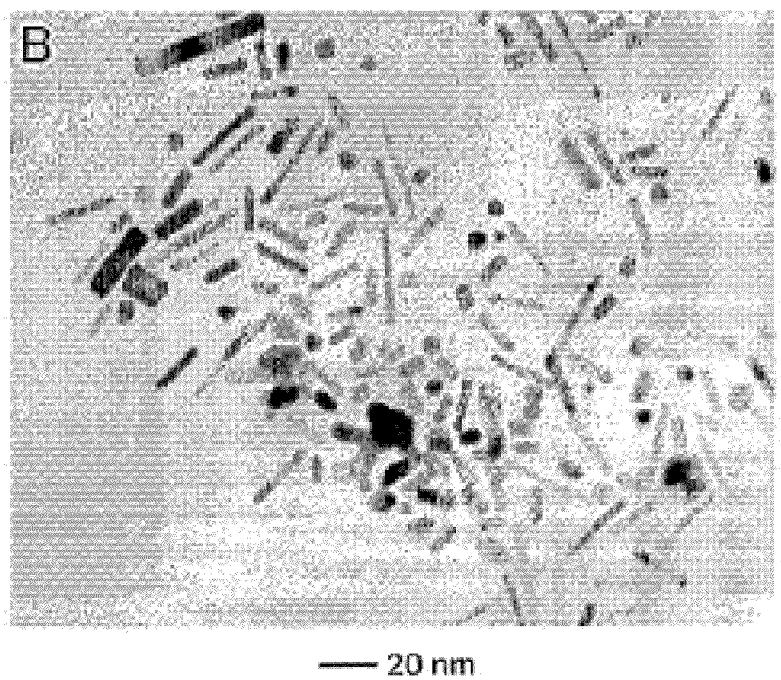
Figure 8C:
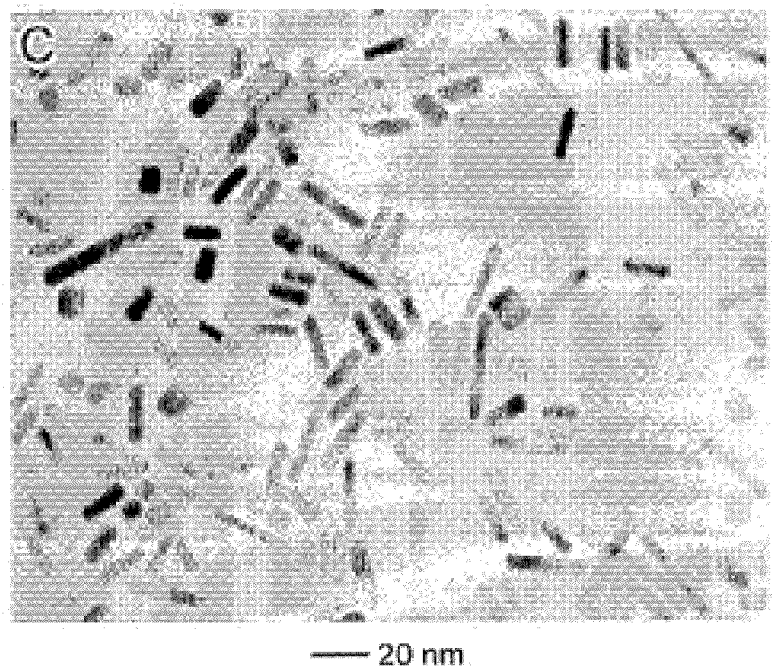
Figure 8D:
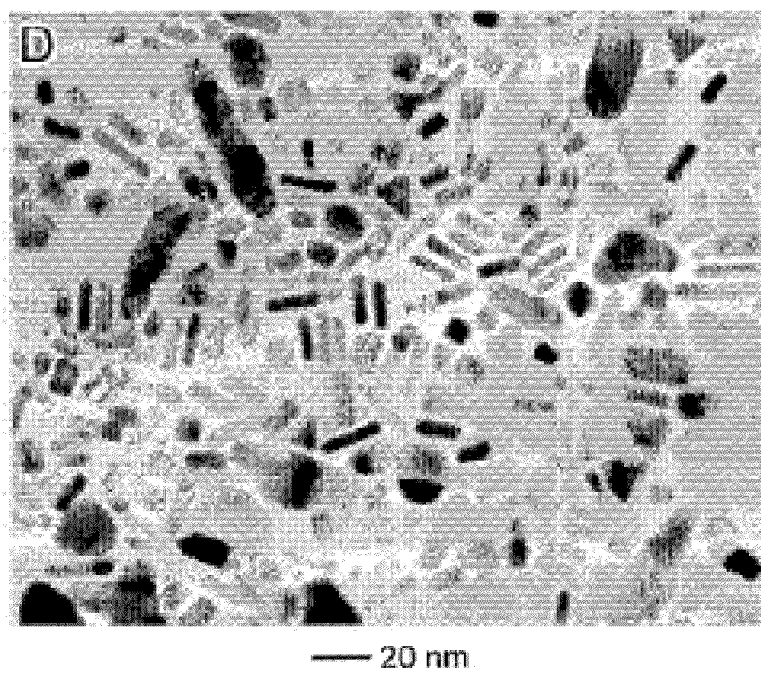

A series of syntheses were performed altering the concentration of KBr in the synthesis, and the results are summarized in FIGS. 7A-7D. As expected, synthesis in the absence of bromide only produced cuboctahedrons. Addition of bromide gradually alters the shape of products to nanobars and nanorods. The appearance of these new shapes implies that the presence of bromide can promote the formation of {100} and {110} facets. The concentration of bromide is also critical to the control of product shape. At low concentration of bromide, the product was a mixture of both nanobars and nanorods (see FIG. 7B). When the molar ratio of KBr to $Na_2PdCl_4$ was increased from 8 through 15 to 30, the major product became nanorods (FIGS. 7B, 7C and 2D). Further increase of bromide concentration led to a decrease for the aspect ratio, as shown in FIG. 4D. Without being bound to this theory, the dependence of morphology on the concentration of bromide can be understood by the following. When the concentration of bromide was increased, the coverage of bromide on particle surface also increased. A higher coverage would protect the nanocrystals better from oxidative etching, and thus make the reaction faster, favoring the formation of nanorods. Because oxidative etching is the key to the formation of nanorods, lack of etching in the reaction system would also restrain their anisotropic growth, resulting in a decrease of the aspect ratio.

It is worth pointing out that a function of bromide in the methods is its adsorption on nanocrystal surface. As bromide is less corrosive than chloride, it cannot make a major contribution to the oxidative etching. For example, when $Na_2PdBr_4$ instead of $Na_2PdCl_4$ was used as the precursor, the morphology exhibited a similar dependence on the concentration of bromide, as shown in FIGS. 8A-8D. As compared to the case with $Na_2PdCl_4$, the samples prepared with $Na_2PdBr_4$ displayed lower aspect ratios. This difference can be attributed to the fact that the rate of oxidative etching was reduced in the absence of chloride (from the $Na_2PdCl_4$ precursor).

Figure 9A:
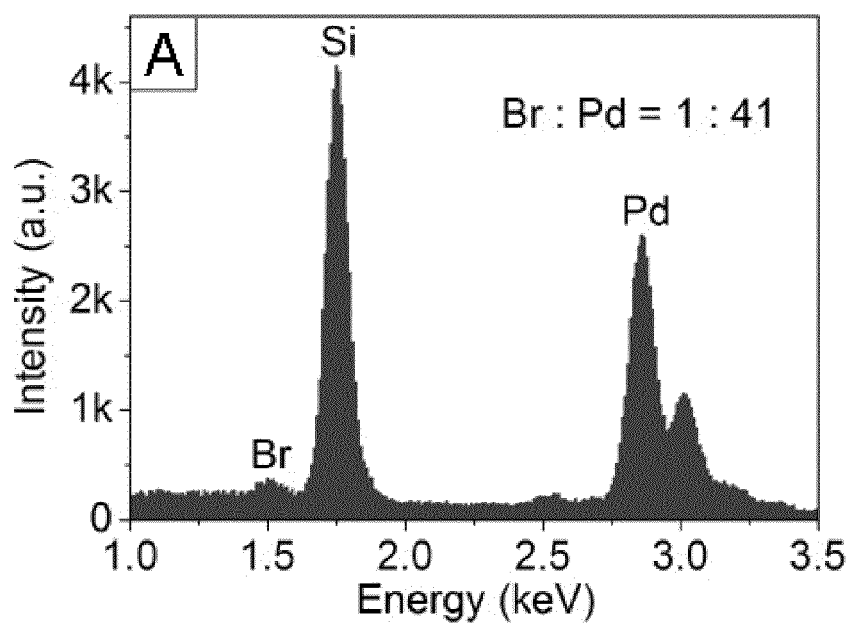
FIGS. 9A and 9B are EDX spectra taken from the nanobars shown in FIG. 2B: (A) as-synthesized and (B) after extensive washing with water.
Figure 9B:
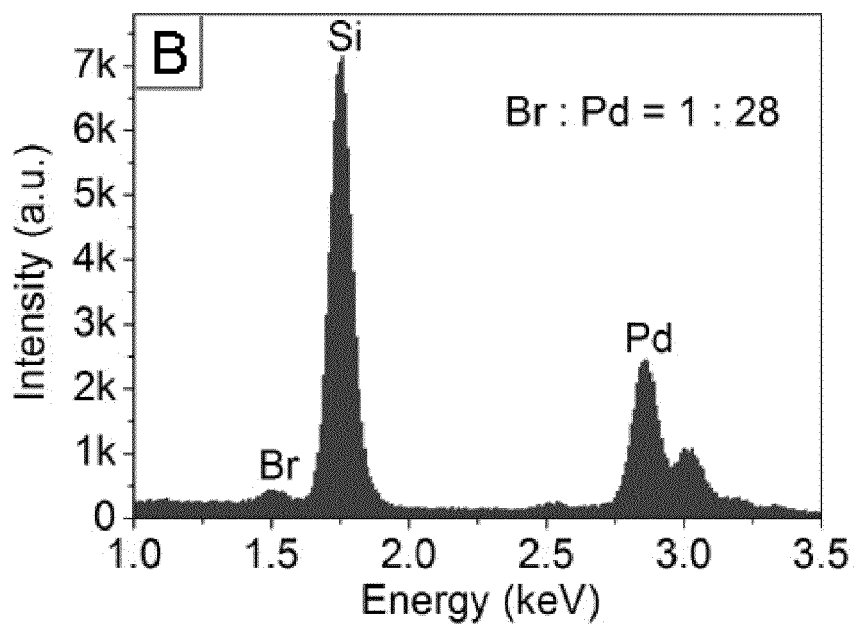
Figure 9C:
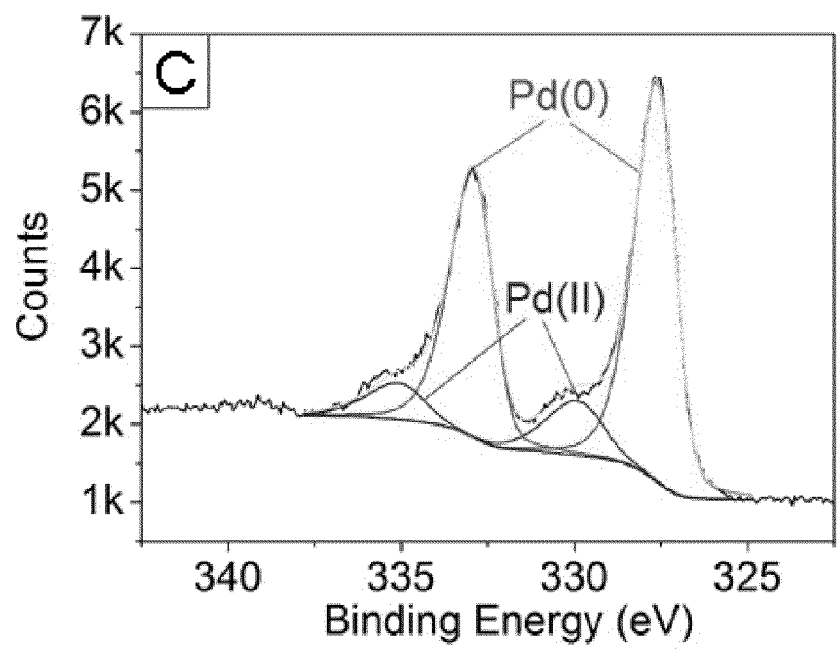
FIGS. 9C and 9D are XPS spectra: (C) high-resolution Pd 3d XPS core level spectrum taken from the nanobars shown in FIG. 2B, and (D) is a high-resolution Br 3d XPS core level spectrum recorded from the nanobars shown in FIG. 2B. The nanobars were extensively washed with water before XPS measurements.
Figure 9D:
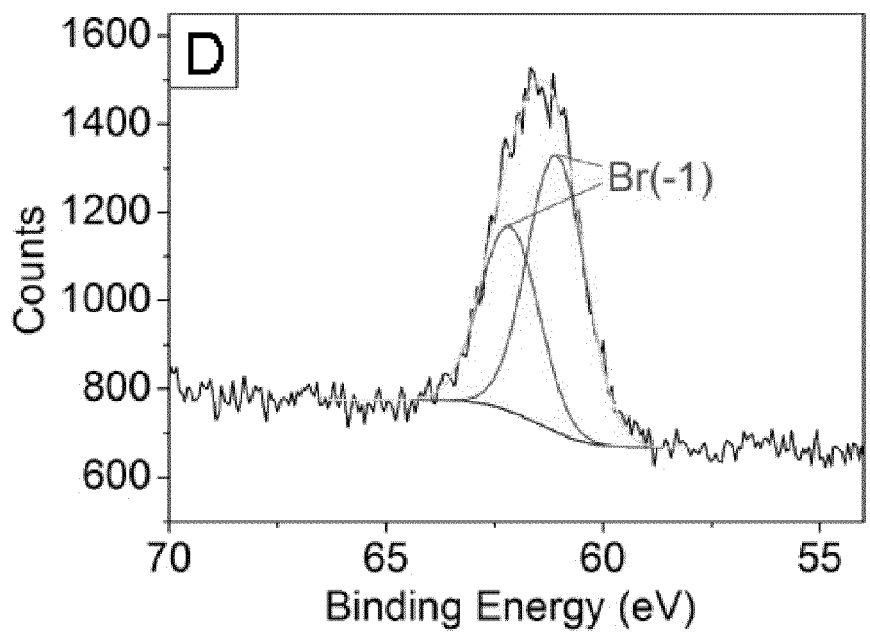
Figure 10:
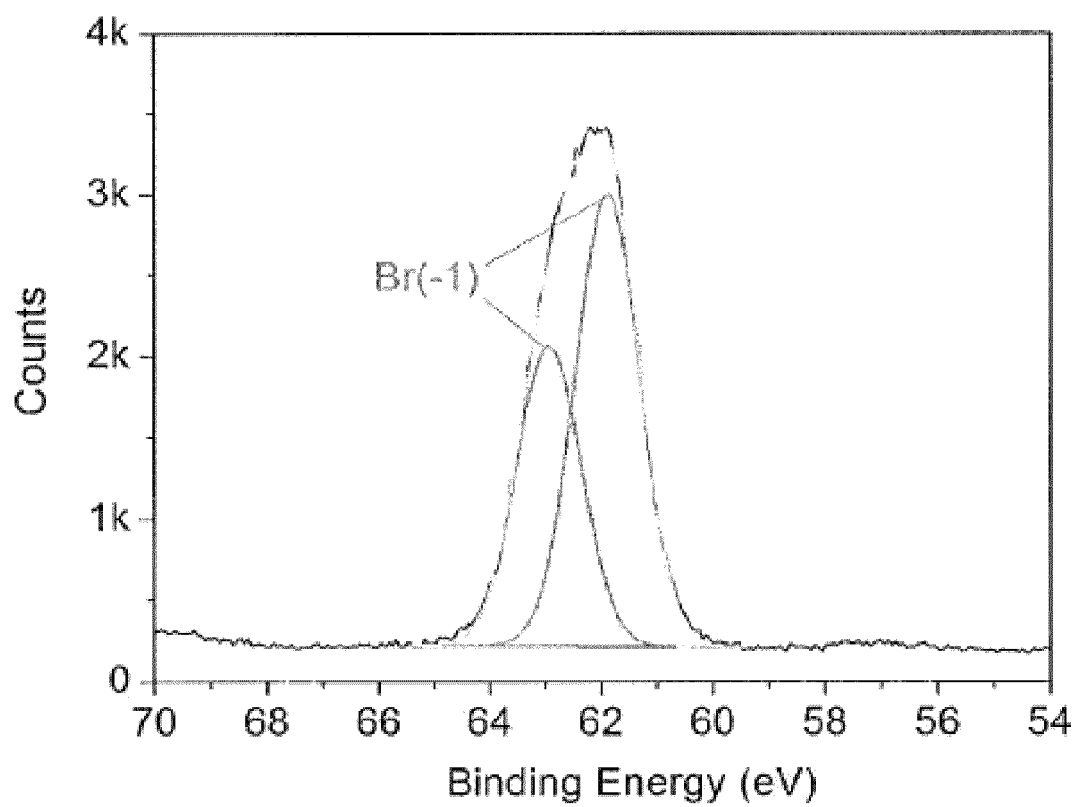
FIG. 10 is a high-resolution XPS core level spectrum for the Br (3d) in KBr.

The presence of bromide on the surface of Pd nanostructures was further confirmed by EDX analysis. FIGS. 9A and 9B show EDX spectra taken from Pd nanobars without washing and after extensive washing with deionized water, respectively. The presence of bromine signals after extensive washing implies that there is a high concentration of bromide strongly bonded to the particle surface. The binding energies of Pd and Br were examined by XPS analysis. The depth of XPS penetration is about 6-10 nm, which ensures the detection of all of the atoms on or in each nanobar. FIG. 9C shows the Pd 3d core level spectrum, which includes two sets of 3d peaks. One set shows Pd $3d_{5/2}$ and Pd $3d_{3/2}$ at 335.2 and 340.5 eV, respectively, which are in accordance with the literature values for bulk Pd(0). The other set includes a Pd $3d_{5/2}$ peak at 337.5 eV and a Pd $3cl_{3/2}$ peak at 342.6 eV, which are close to the reported values for Pd(II)-type samples such as $PdBr_2$. The ratio of Pd(0) to Pd(II) is about 5.27. As shown by the XRD and ED patterns in FIG. 9, there should be no $PdBr_2$, PdO, or other impurities in the sample. A percentage of Pd(II) as high as 16% suggests that Pd atoms on the surface donated electrons to Br for chemical bonding. The Br $3d_{5/2}$ and Br $3d_{3/2}$ binding energies are determined to be 68.7 and 69.8 eV, respectively (see FIG. 9D), which were very close to the literature values for KBr (68.5 and 69.6 eV). As compared to the spectrum of KBr (FIG. 10), the Br 3d peaks in FIG. 9D are much broader. The broadening and small shift of the Br 3d peaks could be attributed to the binding of Br to Pd surface.

Figure 11A:
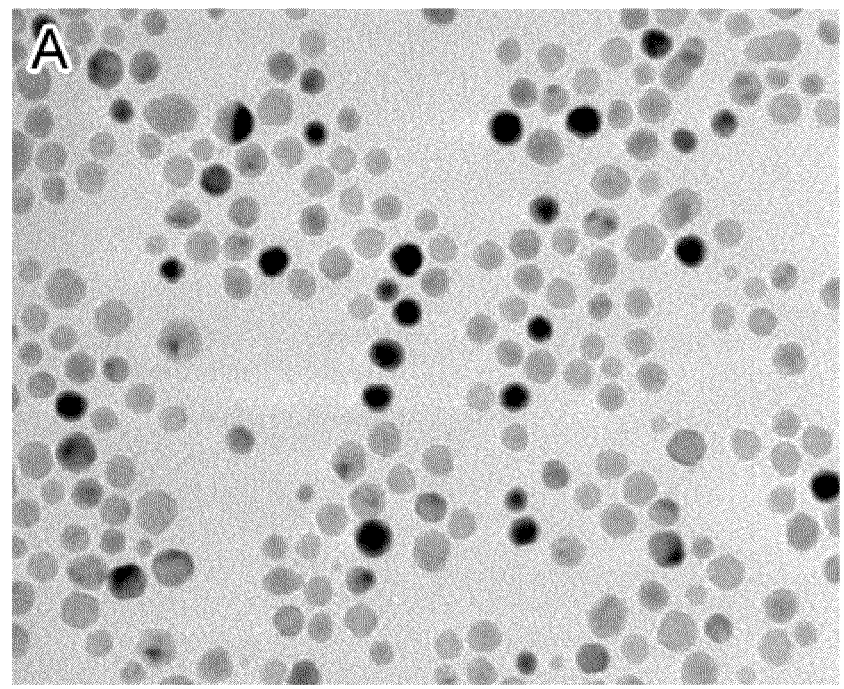
FIGS. 11A and 11B are TEM images of Pd nanoparticles synthesized by using KCl or KI instead of KBr: (A) KCl and (B) KI. All of the syntheses were carried out under the same condition as in FIG. 2D, except for the substitution of KBr by KCl or KI at the same molar concentration.
Figure 11B:
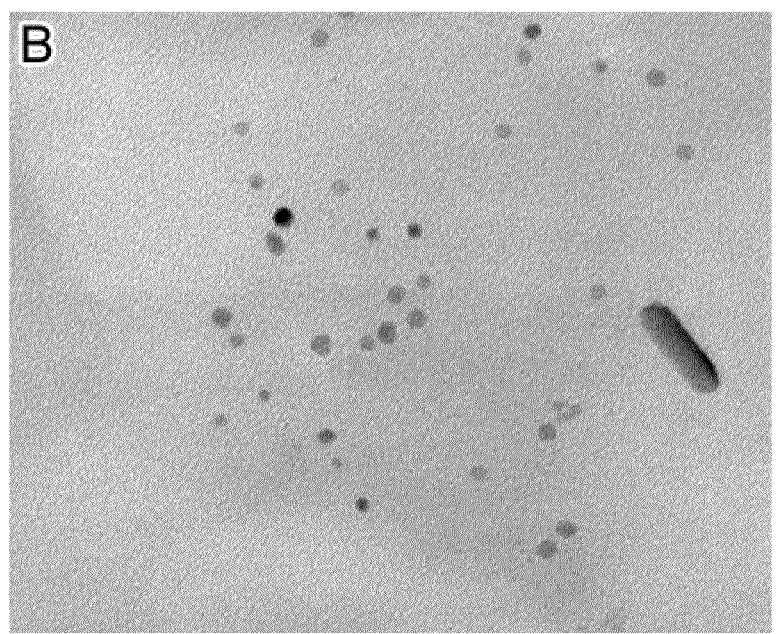

The selection of an appropriate anion for adsorption (or chemisorption) is also instrumental in the growth of Pd nanocrystals with anisotropic shapes. The strength of chemisorption or surface coordination to Pd surface increases in the order of chloride less than bromide less than iodide. For this reason, when KCl was used instead of KBr, the surface protection and promotion of {100} and {110} surfaces were not remarkable, and the product mainly consisted of cuboctahedrons (FIG. 11A). On the contrary, the chemisorption of iodide on the nanocrystal surface is so strong that the particles are difficult to grow into larger sizes with a well-defined shape (FIG. 11B).

Controlling the Shape of Nanostructures. Kinetic control has been used to synthesize metal nanostructures with a number of different shapes. For example, nanoplates of Ag, Au, and Pd have been prepared by slowing the reduction kinetics. The slow reduction can induce the formation of stacking faults and thus break the cubic symmetry. However, over 70% of the surface of these nanostructures were covered by the {111} facets. In the present method, a different mechanism seems to be involved, although it also involves manipulation of reduction and growth kinetics. Based on the results herein, it is believed that three factors are responsible for the formation of Pd nanostructures enclosed by {100} and {110} facets: bromide adsorption, oxidative etching, and reduction kinetics. In the presence of surface adsorption and localized oxidative etching, the rates of nucleation and atomic addition to the surface of seeds (i.e., growth) can be manipulated by controlling the reduction kinetics to generate well-defined nanostructures such as nanobars and nanorods with different aspect ratios.

As shown in the schematic illustration (FIG. 1A), the adsorption of bromide can alter the order of surface free energies, and slightly truncated nanocubes rather than cuboctahedrons will become the most favorable shape. When the reduction rate is in the low or medium regions, the seeds take a cubic shape with slight truncation at the corners. Although the fcc lattice of Pd is highly symmetric, localized oxidative etching creates an active site on one of the six faces, for example, the (100) face, for atomic addition and facilitates the preferential growth along the a-axis in a short period. This preference will break the symmetry of an fcc structure and lead to the formation of nanobars. At a low rate of atomic addition, the rate of growth along the a-axis is not much higher than that of etching on the (100) face, so that the effect of preferential growth along the a-axis is not distinct and thus the aspect ratios of the resultant nanobars are very small (1-1.2). When atomic addition is fast enough, preferential growth on the (100) face becomes most favorable, leading to the formation of nanobars with higher aspect ratios.

Figure 1B:
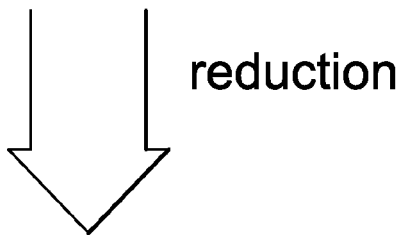
FIG. 1B is a schematic illustration of the formation of a nanorod in accordance with the method of the invention.
Figure 1B:
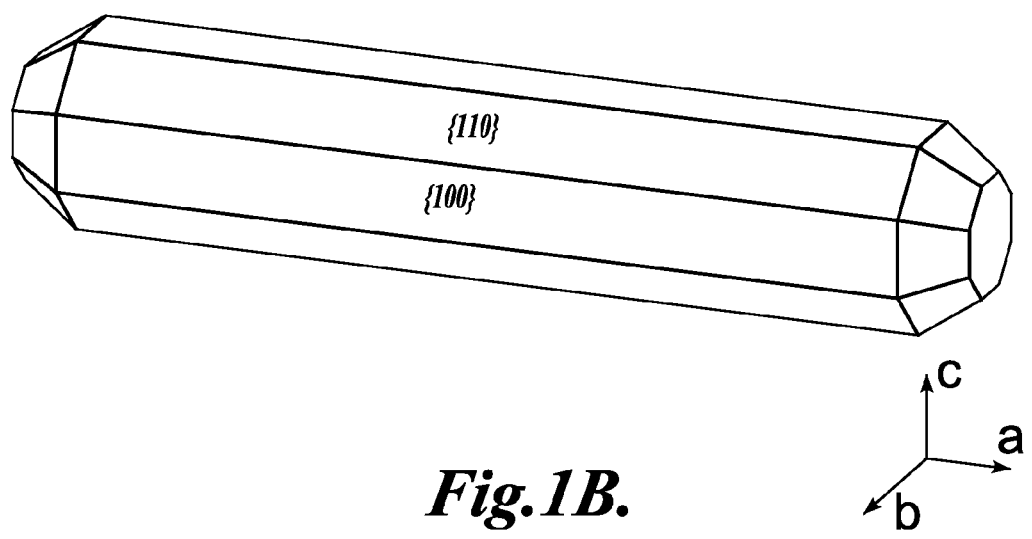
Figure 1C:
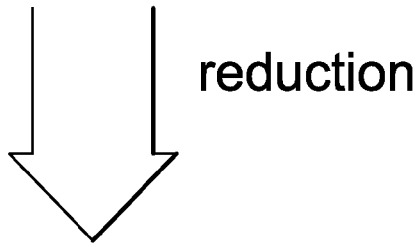
FIG. 1C is a schematic illustration of the formation of a five-fold twinned nanorod in accordance with the method of the invention.
Figure 1C:
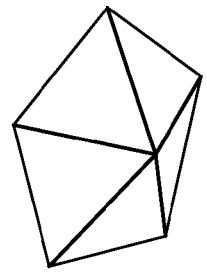
Figure 1C:
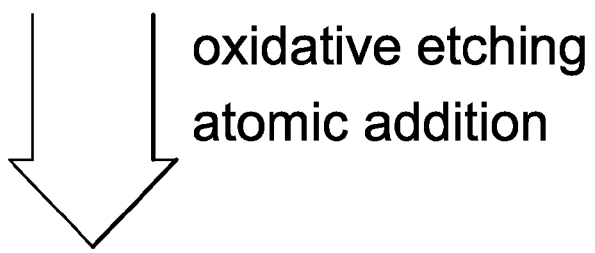
Figure 1C:
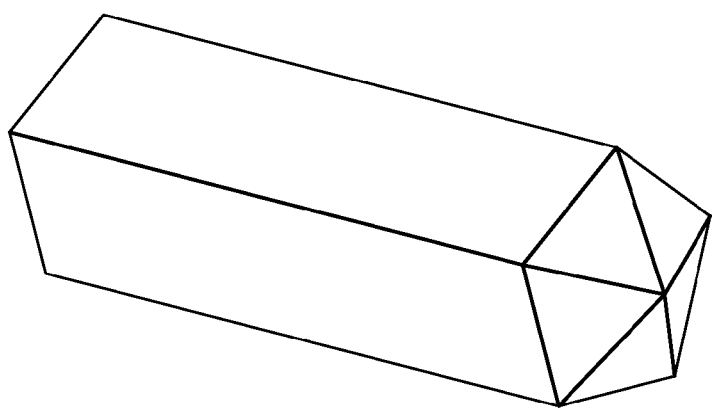
Figure 1C:
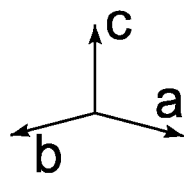

As the reduction rate becomes much faster, the synthesis will follow a different path. Under this condition, more seeds will be formed in the nucleation stage. At the same concentration of Pd precursor, an increase in the number of seeds results in the production of nanocrystals with smaller sizes. On the other hand, the fast nucleation makes the cubic seeds have more significant truncation at the corners, with a shape more close to cuboctahedron. As illustrated in FIG. 1B, preferential growth of a cuboctahedral seed along the a-axis will induce {110} facets as well as {100} facets to be the side surface. The appearance of {110} facets as the side faces will result in the rod-shaped nanostructures with an octagonal cross-section. As a result, the final product is dominated by nanorods thinner than the nanobars. This mechanism can also explain why the shape of the final product can be tailored by manipulating the reduction kinetics.

Figure 12A:
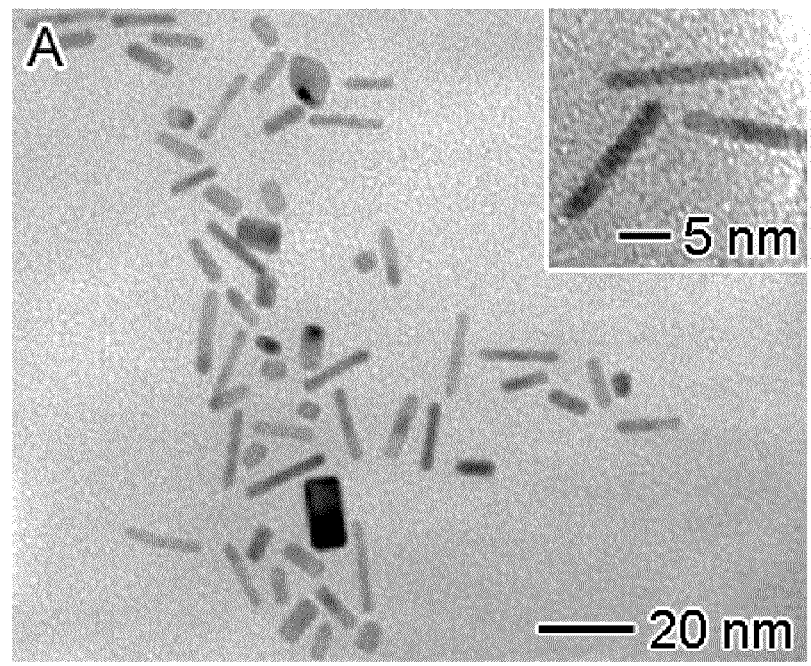
FIGS. 12A-12D are TEM images of Au nanorods and Pt nanobars synthesized using a similar approach: (A) Au nanorods (with the inset showing a blow-up image), and (B) Pt nanobars. (C, D) are high-resolution TEM images of (C) a Pt nanobar recorded along [010] and (D) a Pt nanobar recorded along [1$\bar{1}$0]. The syntheses were performed with a molar ratio of KBr to HAuCl$_4$ (or Na$_2$PtCl$_6$) at 30, in the presence of 75 mM PVP, and in an 11-mL mixture of EG (72.7%) and water at 140° C.

Formation of Au Nanorods and Pt Nanobars. As noted above, the methods of the invention described above for forming Pd nanostructures are applicable to other metals (e.g., Pt, Au, and Ag) to provide, for example, single-crystal Au nanorods. FIG. 12A shows a typical TEM image of Au nanorods synthesized in the presence of KBr. The nanorods have a diameter of ca. 2.5 nm and length up to 20 nm. The yield of nanorods was around 40%, while the other 60% of the product was microscale aggregates. We note that their structure is the same as that of the Pd nanorods with the side faces being bounded by a mix of {100} and {110} facets. Bromide alone alters the surface energies and promote highly anisotropic growth.

Figure 12B:
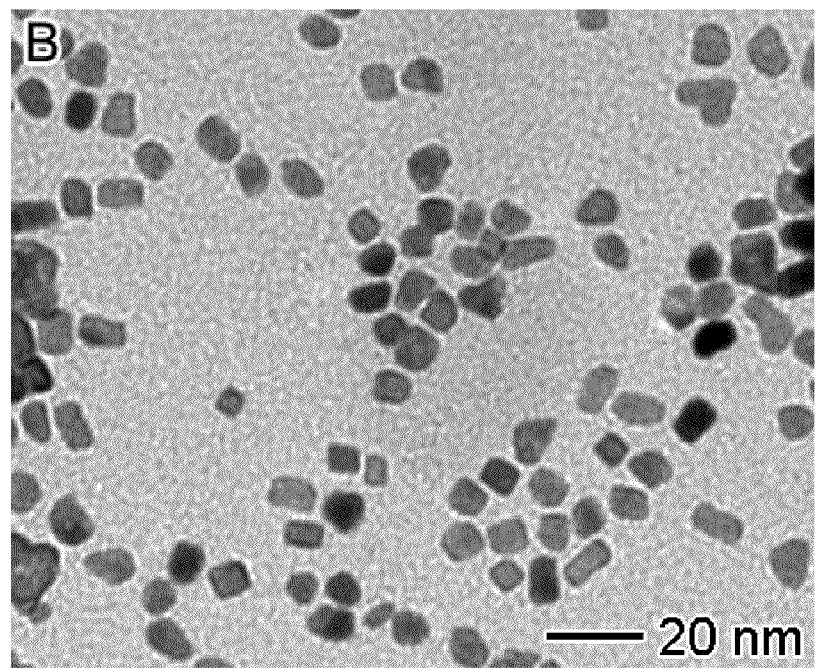
Figure 12C:
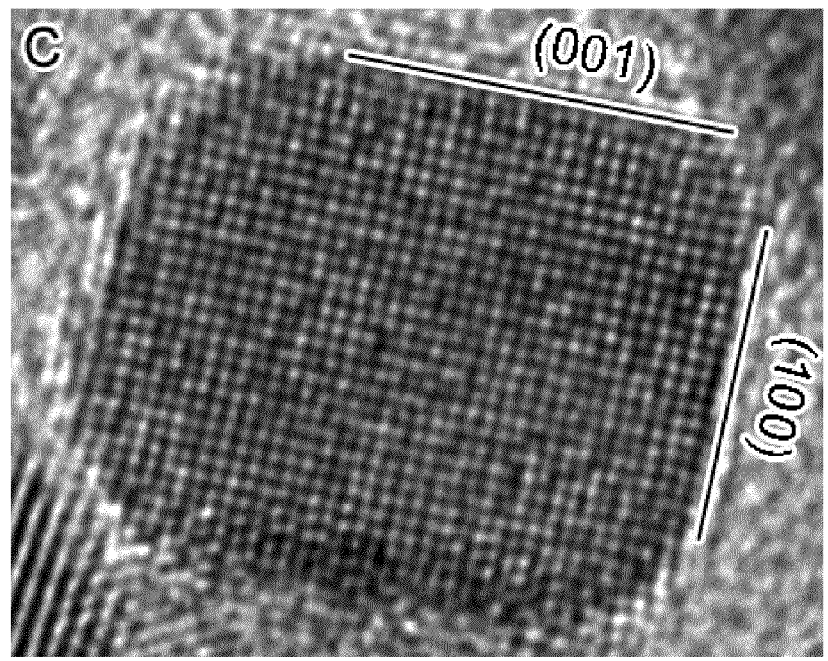
Figure 12D:
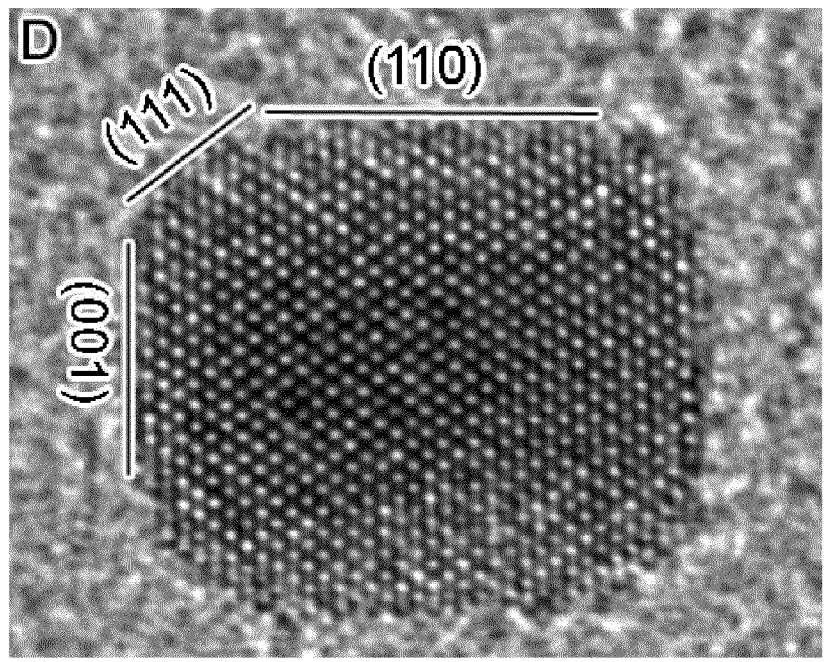
Figure 13A:
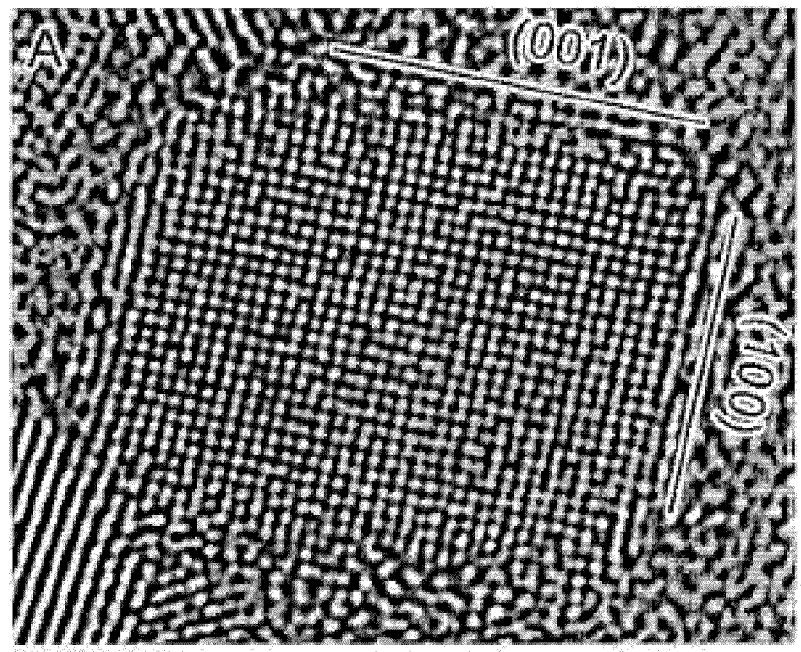
FIGS. 13A and 13B are high-resolution TEM images that were obtained by filtering the images in FIGS. 12C and 12D with a Gatan Digital Micrograph program: (A) a Pt nanobar recorded along [010] axis; and (B) a Pt nanobar recorded along [1$\bar{1}$0] axis.
Figure 13B:
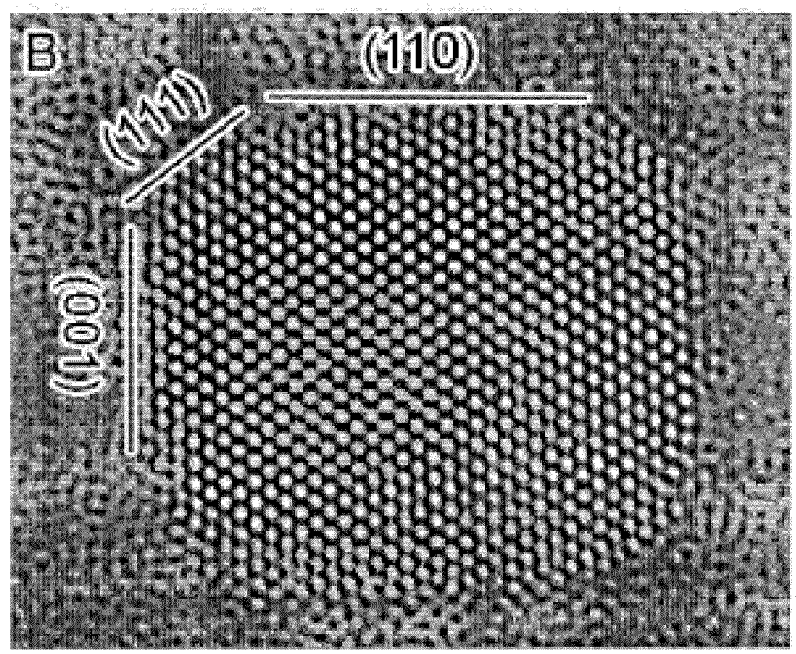

The present method can also be applied to Pt nanostructures. As shown in FIG. 12B, the product consisted of nanobars with an aspect ratio of 2-3 and a yield above 90%. FIG. 12C shows a high-resolution TEM image of a Pt nanobar recorded along [010]. The fringes show a period of 1.9 Å, which was consistent with the {200} lattice spacing of fcc Pt. This image also displayed well-resolved, continuous fringes with the same orientation, suggesting that each Pt nanobar is a piece of single crystal enclosed by {100} facets. FIG. 12D shows a high-resolution TEM image of a Pt nanobar with a different structure, which was recorded along [1$\bar{1}$0]. The side facets are {110}, and the growth direction is also [001]. The ends of the nanobar are terminated by the (001) face and {111} facets. This result also supports formation of {100} and {110} surfaces by the addition of bromide.

Figure 14A:
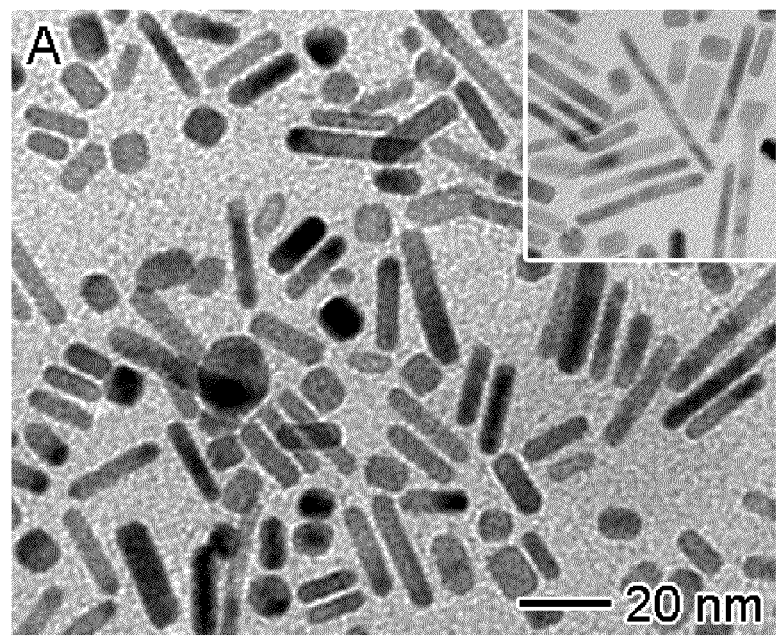
FIGS. 14A-14D are electron microscopy images after the Pd nanorods and nanobars in FIGS. 2F and 2A had been aged in the reaction solution for 2 weeks at room temperature: (A) TEM image of nanorods after aging; (B) TEM image of nanobars after aging; (C) high-resolution TEM image of a nanobar with an aspect ratio of about 2.5 after aging that was recorded along [1$\bar{1}$0]; and (D) high-resolution TEM image of a nanobar with an aspect ratio of about 1 after aging that was recorded along [010]. The insets in panels (A) and (B) show two TEM images of the corresponding samples before the aging process, at the same magnification as in (A) and (B).
Figure 14B:
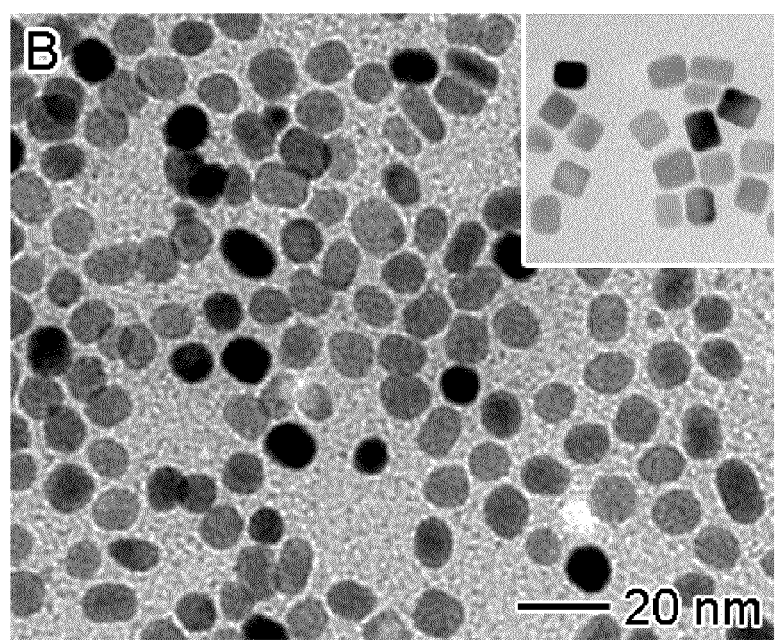
Figure 14C:
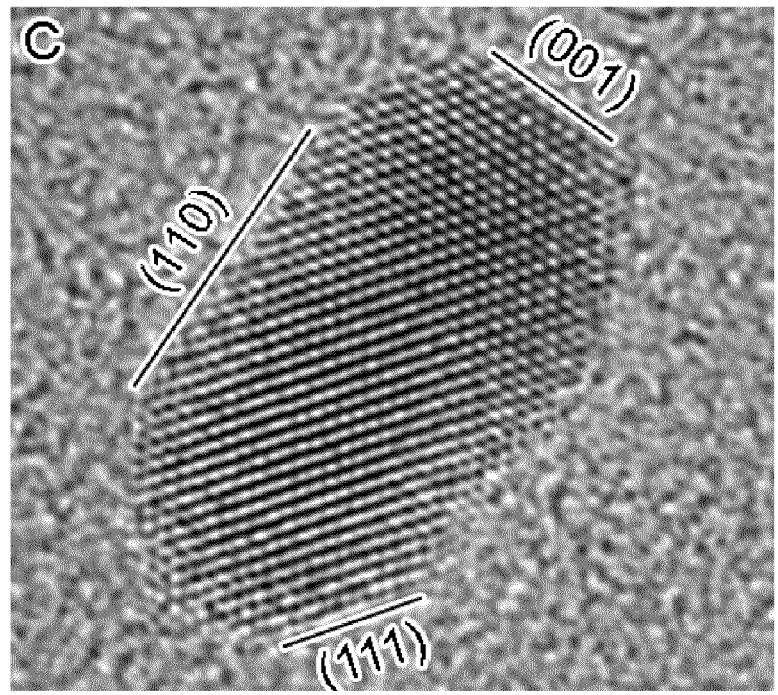
Figure 14D:
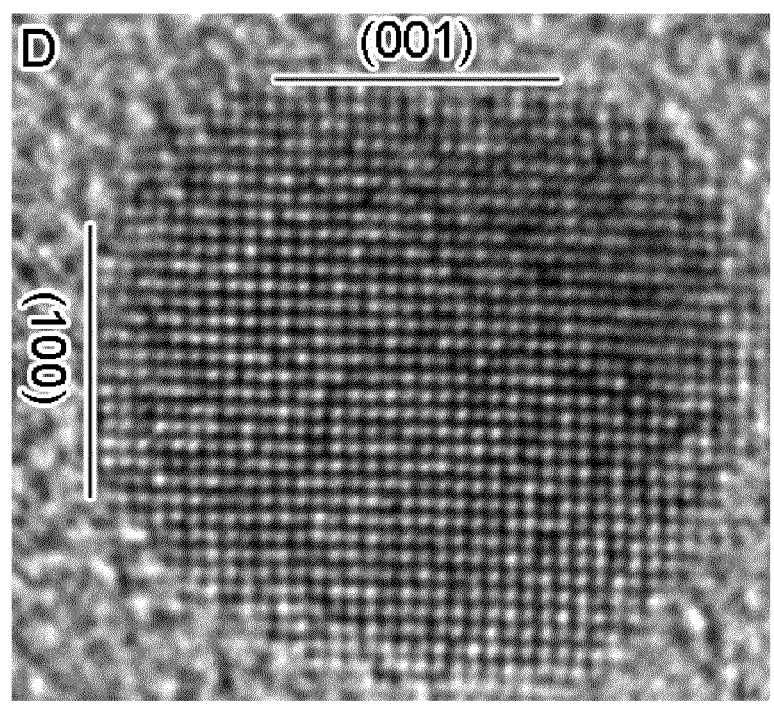
Figure 15:
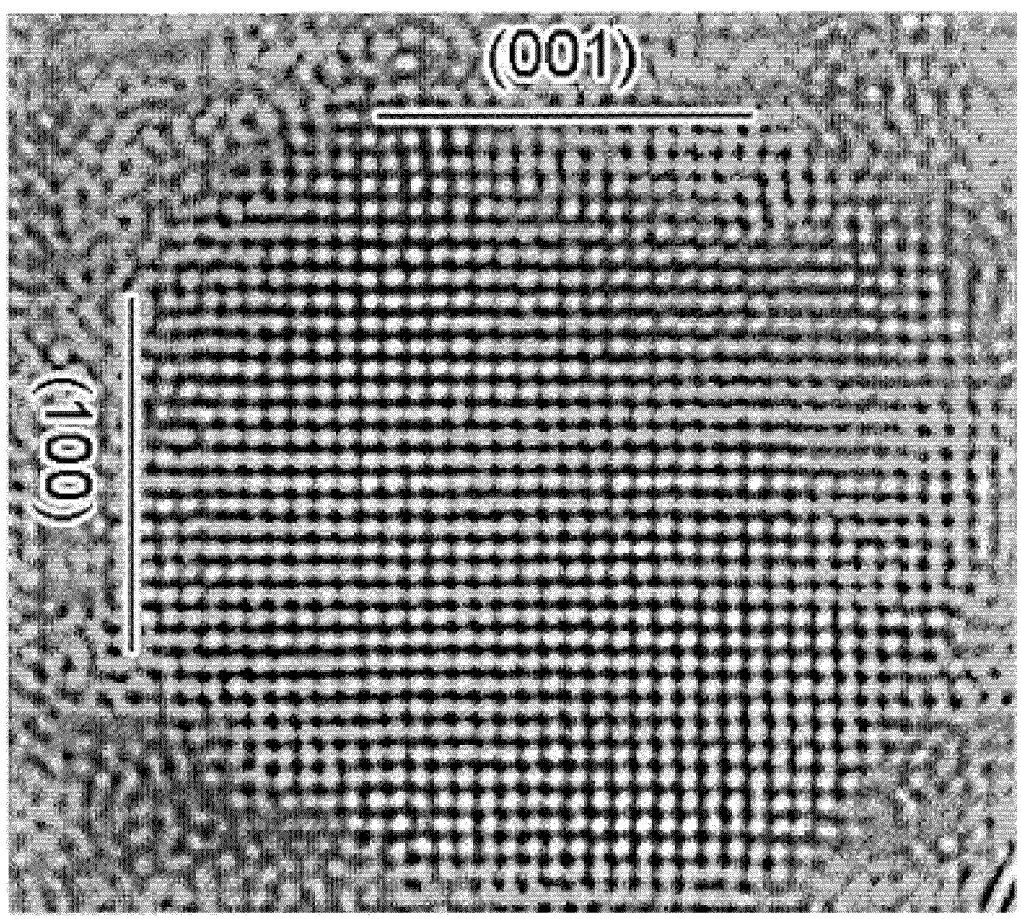
FIG. 15 is a high-resolution TEM image of a cuboctahedron formed through an aging process. This image was obtained by filtering the image in FIG. 14D with a Gatan Digital Micrograph program.

Stability of the Nanostructures. As discussed above, in the method of the invention the formation of Pd nanobars and nanorods can be governed by kinetics. For this reason, they are not thermodynamically stable due to their relatively high surface energies. To evaluate their stability, the products were aged in the reaction solution for 2 weeks at room temperature. As shown in FIG. 14A, the diameter of nanorods increased while their length decreased during the aging process. For the nanobars, the aging process made them more severely truncated (see FIG. 14B). High-resolution TEM images (FIG. 14C) indicate that the nanobars had been evolved into nanorods with both {110} and {100} facets as side faces. The high-resolution TEM study also revealed that the nanobars with an aspect ratio of about 1 transformed into cuboctahedrons, a shape more favored by thermodynamics, as depicted in FIGS. 14D and 15. The short nanorods formed through the aging process should be some intermediates on the pathway to the thermodynamically favorable shape.

Figure 1D:
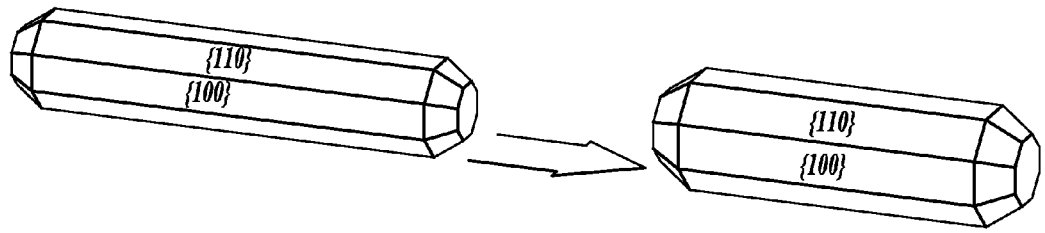
FIG. 1D is a schematic illustration of the decrease of aspect ratio for a nanorod.
Figure 1E:
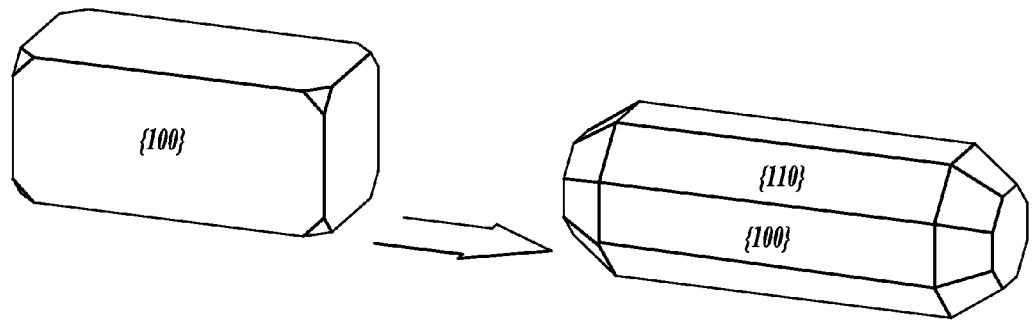
FIG. 1E is a schematic illustration of the evolution of a nanobar into a nanorod.
Figure 1F:
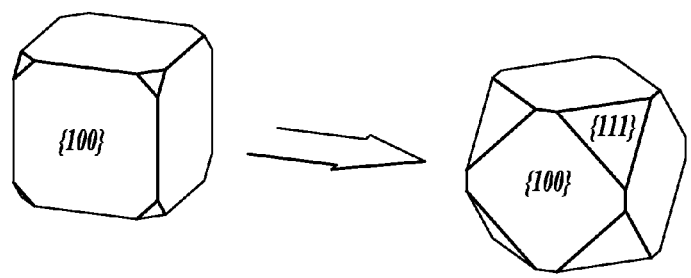
FIG. 1F is a schematic illustration of the evolution of a nanobar with an aspect ratio of about 1 into a cuboctahedron.

These observations imply that the anisotropic nanostructures formed through kinetic control were not stable shapes and they would evolve into the thermodynamically favorable shape. This aging process is supposed to be mainly governed by thermodynamics, following a process illustrated in FIGS. 1D-1F. The loss of atoms from {111} facets and the addition of atoms to {100} facets resulted in the enlargement of {111} facets and the shrinkage of {100} facets, transforming Pd cubes into cuboctahedrons (see FIG. 1F). Multiple processes might be involved in this shape evolution, such as oxidative etching, desorption of bromide, and surface diffusion. However, minimization of the surface energy of a particle should be the major driving force for such a transformation.

Figure 16A:
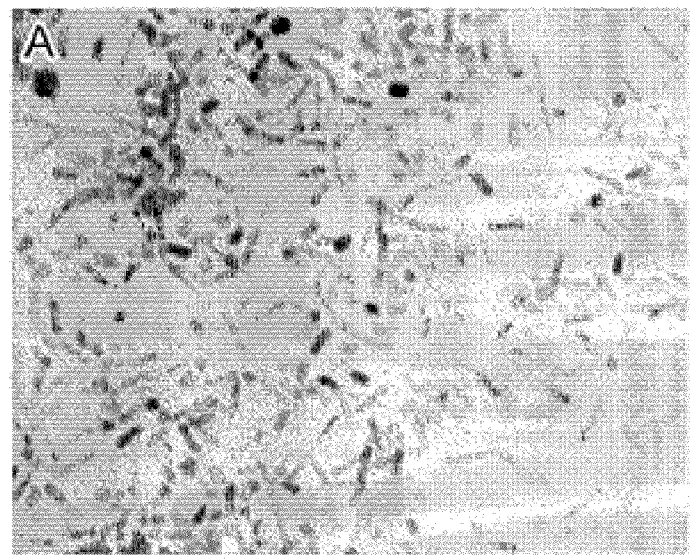
FIGS. 16A and 16B are TEM images of samples prepared under the same condition as in FIG. 2D (t=1 h) except that the reaction time was (A) shortened to 10 min; and (B) prolonged to 3 h, respectively. At t=10 min, the sample mainly contained nanorods (1.8 nm×12 nm), suggesting that the nanorods shown in FIG. 2 were formed through nucleation and growth (as depicted in FIG. 1B) rather than evolution from nanobars during an aging process (FIG. 1D). During the next 50 min, the nanorods slowly grew to 2 nm×16 nm. If the reaction was allowed to proceed to t=3 h, the diameter of nanorods increased while their length decreased, indicating that an aging process occurred between t=1 h and t=3 h.
Figure 16B:
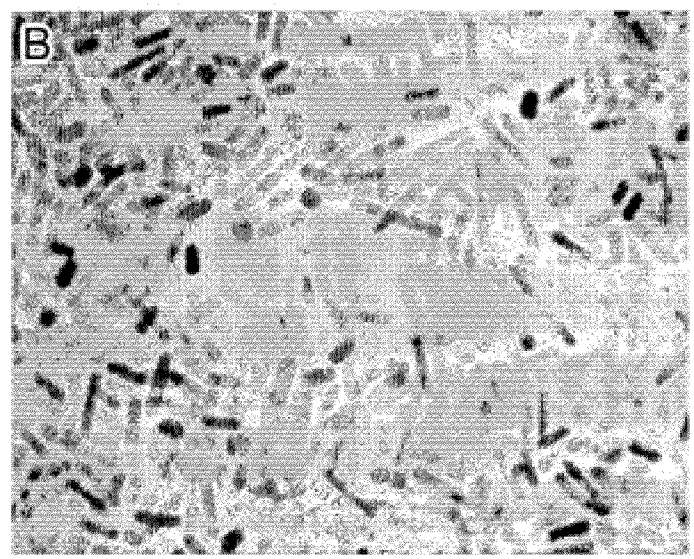

It is worth pointing out that the Pd nanorods in FIG. 2 should be formed via growth from small, near spherical seeds, rather than through the evolution of nanobars in an aging process. This point was supported by the evolution of shape, which was monitored with TEM by taking samples at various reaction times (FIG. 16). The TEM observation suggests that the Pd nanorods could be formed in the stage as early as t=10 min. The smaller diameter of nanorods relative to nanobars (2 vs. 6 nm, FIG. 2) also supports this argument because nanorods evolved from nanobars during aging should have a thicker diameter.

In one embodiment, the invention provides a method for growing highly anisotropic palladium nanostructures, single-crystal nanobars bounded by {100} facets and single-crystal nanorods with their side surfaces enclosed by {100} and {110} facets. According to both the theoretical prediction and the experimental observation, Pd atoms should nucleate and grow in a solution phase to form the thermodynamically favored shape, cuboctahedrons with the surface bounded by a mix of both {111} and {100} facets. In the present method, three steps were combined to obtain elongated nanostructures: (i) speedy reduction of precursor to ensure prompt addition of atoms to the seed; (ii) adsorption of bromide on the seed surface to alter the order of -free energies of different facets and promote the formation of {100} and {110} facets; and (iii) localized oxidative etching on one specific face of the seed to break the cubic symmetry. These anisotropic nanostructures formed via kinetic control were not stable, and they tended to evolve into the thermodynamically favored shape during aging.

The present method demonstrates, for the first time, that cubic symmetry of an fcc metal can not only be broken by forming twin defects, but also through localized oxidative etching. The method also suggests the role of bromide as a capping agent to influence the surface energies of different facets of an fcc metal and therefore induce the formation of new shapes not favorable from the perspective of thermodynamics.

The following examples are provided for the purpose of illustrating, not limiting the invention.

EXAMPLES

Chemicals and Materials. Ethylene glycol (EG, J. T. Baker, 9300-01), sodium palladium (II) chloride ($Na_2PdCl_4$, Aldrich, 379808-1g), potassium bromide (KBr, Fisher, P205-100g), and poly(vinylpyrrolidone) (PVP, MW=55 000, Aldrich, 856568-100g) were all used as received without further purification.

Instrumentation. TEM images were captured using a Phillips 420 transmission electron microscope operated at 120 kV. High-resolution TEM images and ED patterns were taken on a JEOL, field-emission transmission electron microscope (2100F) operated at 200 kV. Filtered images were generated by inverse FFT with a Gatan Digital Micrograph program. EDX analysis was performed on a FEI field-emission scanning electron microscope (Sidon XL) operated at an accelerating voltage of 10 kV. Samples for TEM and EDX studies were prepared by shying a drop of the aqueous suspension of particles on carbon-coated copper grids (Ted Pella, Redding, Calif.) or silicon wafers under ambient conditions. Before imaging, the TEM and SEM samples were placed in a homemade, gravity-fed flow cell and washed for 1 h with deionized water to remove excess PVP. Finally, the samples were dried and stored in vacuum for TEM and EDX characterization. All powder XRD patterns were recorded using a Philips 1820 diffractometer equipped with a Cu Ka. radiation source ($\lambda$=1.54180 Å), and the samples were deposited onto glass slides.

XPS measurements were performed using a Surface Science X-Probe spectrometer equipped with an Al K$\alpha$ monochromatized X-ray source (E=1.486.6 eV) with a penetration depth of 6-10 nm. The instrument was operated at a pressure of $5 \times 10^{-9}$ Torr in the analysis chamber. The X-ray spot had an elliptical shape with a short axis of 800 μm when focused on the surface, and the analyzer had an angle of 55° with respect to the surface normal of the sample. Photoelectrons were collected with a pass energy of 150 eV for surveys and 50 eV for high-resolution spectra. The binding energies were calculated relative to the maximum intensity of the C 1s signal at 285.0 eV. Analysis of the spectra was executed using the ESCA VB data reduction software provided by Service Physics. A submonolayer of Pd nanobars was deposited on small pieces of silicon (0.5×0.5 $cm^2$ in size) for all XPS samples.

Example 1

Synthesis of Representative Palladium Nanostructures: Nanorods having an Aspect Ratio of 8

In this example, the synthesis of representative palladium nanostructures of the invention are described: nanorods having an aspect ratio of about 8.

In a typical synthesis, 5 mL of EG was hosted in a 25-mL, three-neck flask (equipped with a reflux condenser and a Teflon-coated magnetic stirring bar) and heated in air under magnetic stirring at 100° C. Meanwhile, 0.0486 g of $Na_2PdCl_4$ and 0.600 g of KBr were dissolved in 3 mL of water, and 0.0916 g of PVP was dissolved in 3 mL of EG at room temperature. These two solutions (with the molar ratio of $PdCl_4^2$ to Br⁻ and the repeating unit of PVP being 1:30:15) were then injected simultaneously into the flask using a two-channel syringe pump (KDS200, Stoelting, Wood Dale, Ill.) at a rate of 45 mL per hour. The reaction mixture was heated at 100° C. in air for 1 h before the product was collected by centrifugation and washed with acetone once and with ethanol three times to remove most of the EG and excess PVP. The as-obtained samples were characterized by transmission electron microscopy (TEM), high-resolution TEM, electron diffraction (ED), energy-dispersive X-ray (EDX) analysis, powder X-ray diffraction (PXRD), and X-ray photoelectron spectroscopy (XPS).

Example 2

Synthesis of Representative Palladium Nanostructures: Nanobars having Aspect Ratios of 2 to 4

In this example, the synthesis of representative palladium nanostructures of the invention are described: nanobars having aspect ratios of from about 2 to about 4.

The procedure was similar to that described above in Example 1 for palladium nanorods, except that the PVP was dissolved in 3 mL of water instead of EG.

Example 3

Synthesis of Representative Palladium Nanostructures: Nanobars having Aspect Ratios of 1 to 1.2

In this example, the synthesis of representative palladium nanostructures of the invention are described: nanobars having aspect ratios of from about 1 to about 1.2.

The procedure was similar to that described above in Example 1 for palladium nanorods, except that the solvent for all solutions was water instead of EG. In this case, the hydroxyl end group of PVP served as the reducing agent.

Example 4

Synthesis of Representative Palladium Nanostructures: Five-Fold Twinned Nanobars In this example, the synthesis of representative palladium nanostructures of the invention are described: five-fold twinned nanobars having aspect ratios up to about 20.

Synthesis of palladium nanorods and right bipyramids. In a typical synthesis, 0.105 g of poly(vinylpyrrolidone) (PVP, MW=55,000, Aldrich, 856568-100g) and 0.023 g of L-(+)-ascorbic acid ($C_6H_8O_6$, J. T. Baker, B581-05-100g) were dissolved in 8.0 mL of water hosted in a 25-mL, 3-neck flask (equipped with a reflux condenser and a Teflon-coated magnetic stirring bar) and then heated to 80° C. in air under magnetic stirring. Meanwhile, 0.056 g of sodium palladium (II) chloride ($Na_2PdCl_4$, Aldrich, 379808-1g) and 0.600 g of potassium bromide (KBr, Fisher, P205-100g) were dissolved in 3.0 mL of water and rapidly added into the flask. The reaction mixture was continued with heating at 80° C. in air for 3 h before the product was collected by centrifugation and washed with acetone (once) and ethanol (three times) to remove excess PVP. The samples were then characterized by scanning electron microscopy (SEM), transmission electron microscopy (TEM), and high-resolution TEM.

Separation of palladium nanorods. The palladium nanorods were separated from particles by filtering through a membrane. In this case, the as-synthesized sample was dispersed in water and then filtered through a circular inorganic membrane with a pore size of 100 nm (Anodisc 13, Catalog NO. 6809-7013, Whatman International, Maidstone, England).

Electron microscopy characterization. The sample for TEM or SEM study was prepared by drying a drop of the aqueous suspension of particles on a piece of carbon-coated copper grid (Ted Pella, Redding, Calif.) or silicon wafer under ambient conditions. After drying, the TEM grid or silicon wafer was transferred to a gravity-fed flow cell and washed for 1 h with deionized water to remove excess PVP. Finally, the sample was dried and stored in vacuum for electron microscopy characterization. TEM images were captured using a Philips CM100 transmission electron microscope operated at 100 kV, equipped with a Gatan Model 689 digital slow scan camera. SEM images were taken on a FEI field-emission microscope (Sirion XL) operated at an accelerating voltage of 20 kV. High-resolution TEM images were taken on a JEOL 2010 LaB6 high-resolution transmission electron microscope operated at 200 kV.

Figure 17A:
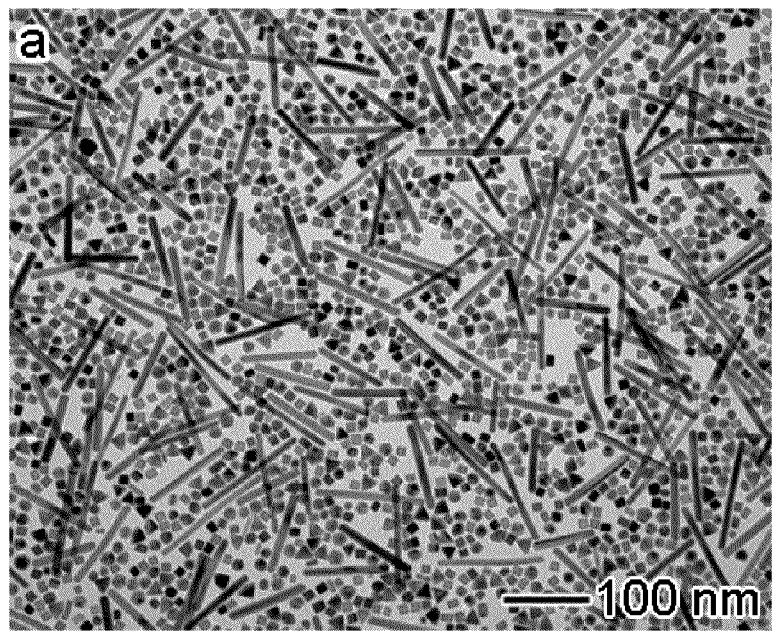
FIGS. 17A-17D are images of representative five-fold twinned nanorods.
Figure 17B:
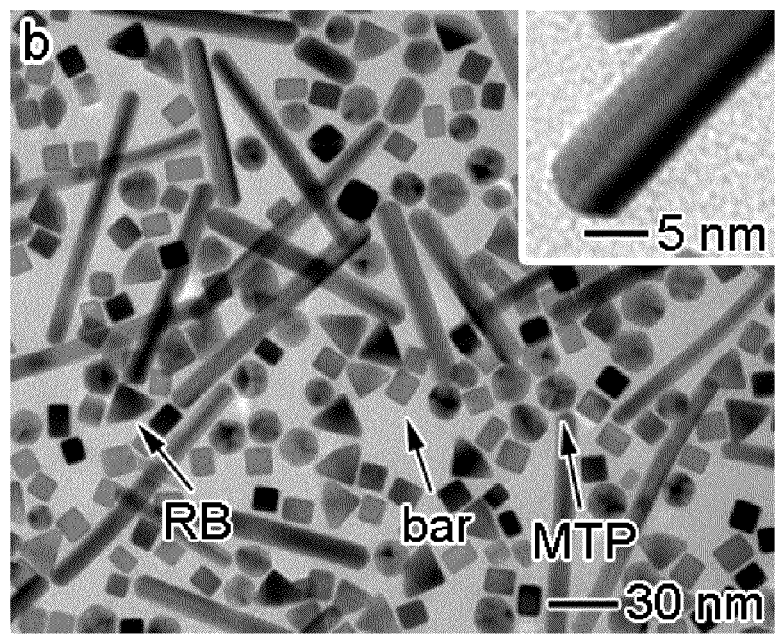
Figure 17C:
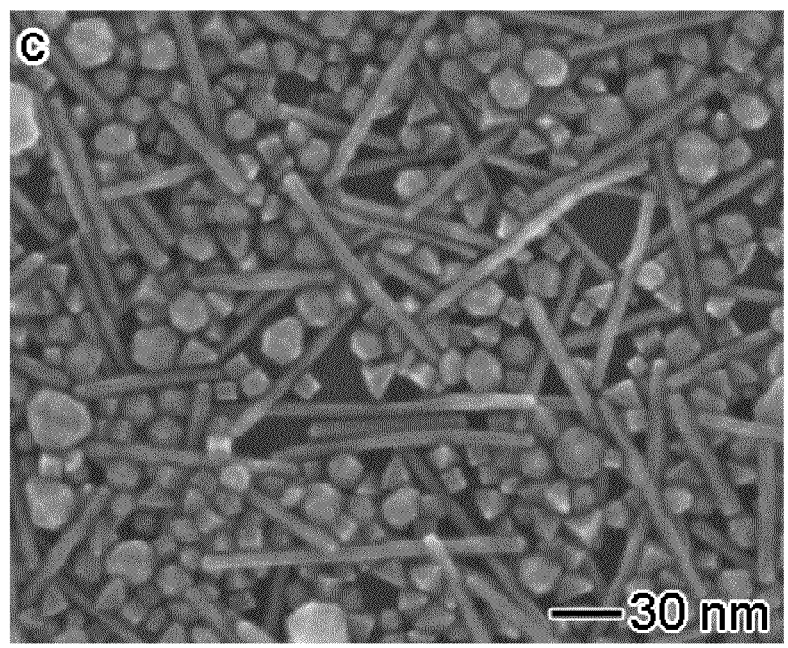

Results. The synthesis was typically conducted at 80° C. in an aqueous solution containing ascorbic acid, KBr, and PVP, with the addition of $Na_2PdCl_4$ as a precursor to palladium atoms. The PVP served as a colloidal stabilizer, while the ascorbic acid acted as a reducing agent. The bromide was mainly used to promote the formation of {100} facets. FIGS. 17A-17C show TEM and SEM images of a typical product which contained 30% five-fold twinned nanorods of about 8 nm in diameter and lengths up to 150 nm, 17% 10-nm multiple twinned particles (MTPs, including both icosahedrons and decahedrons), 18% single twinned right bipyramids (i.e., structures with two right tetrahedrons symmetrically placed base-to-base) of about 10 nm in edge length (at the base), and 35% single-crystal nanocubes and nanobars (i.e., anisotropic structures with a square cross-section and aspect ratios of 1-1.2). It is worth pointing out that the nanorods can be separated from other structures by filtering through a membrane with a pore size of 100 nm, thanks to their relatively long lengths and high yields.

Figure 17D:
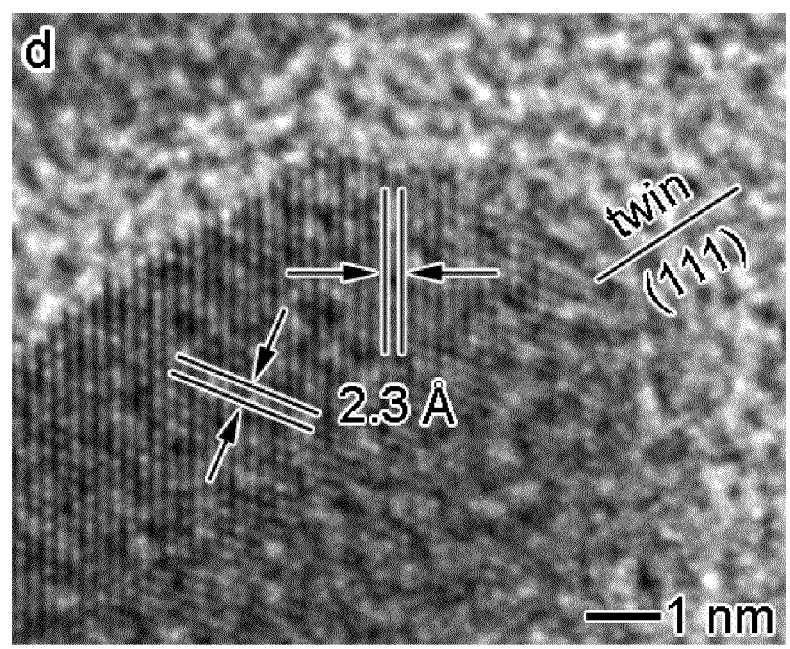

The structure of these palladium nanorods was further studied using high-resolution TEM. Previous studies on silver and gold nanorods indicate that each five-fold twinned nanorod is composed of five single-crystal subunits connected by {111} twin planes, so that each nanorod has five equivalently flat side {100} surfaces. Such a nanorod should preferentially lie on a flat surface against one of its side faces rather than one of its edges. No matter which side face is in contact with the TEM grid during sample preparation, a twin boundary always appears in the middle of the nanorod (see the inset of FIG. 17B). The high-resolution TEM image shown in FIG. 17D, recorded from the end of a palladium nanorod, exhibits a (111) twin plane oriented parallel to its longitudinal axis. Each side of this twinned nanorod is a piece of single crystal with well-resolved interference fringe spacing. It is worth emphasizing that the twin boundary is straight and continuous along the entire longitudinal axis of each nanorod.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method for making a crystalline anisotropic palladium, platinum, or gold nanostructure, comprising:
    (a) adsorbing bromide to one or more surfaces of a seed to provide a seed having adsorbed bromide, wherein the seed is selected from the group consisting of palladium, platinum, and gold seeds;
    (b) reducing a precursor at a rate sufficient to add palladium, platinum, or gold metal atoms to the seed having adsorbed bromide; and
    (c) oxidatively etching one surface of the seed having adsorbed bromide to break symmetry to promote growth of the seed along an axis of the seed to provide an anisotropic palladium, platinum, or gold nanostructure.

2. The method of claim 1, wherein the seed is a palladium seed and has face-centered cubic (fcc) symmetry.

3. The method of claim 1, wherein the seed is a palladium seed and is a single crystal.

4. The method of claim 1, wherein the seed is a multiple twinned crystal.

5. The method of claim 1, wherein the precursor is selected from the group consisting of $Na_2PdCl_4$ and $Na_2PdBr_4$.

6. The method of claim 1, wherein reducing the precursor comprises treating the precursor with a reducing agent selected from the group consisting of ethylene glycol and di(ethylene glycol).

7. The method of claim 1, wherein adsorbing bromide to one or more surfaces of the seed comprises altering the order of free energies of the surfaces to promote the formation of {100} and {110} facets.

8. The method of claim 1, wherein adsorbing bromide to one or more surfaces of the seed comprises treating the seed with potassium bromide.

9. The method of claim 1, wherein oxidatively etching one surface of the seed comprises breaking symmetry to promote growth of the seed along an axis of the seed to provide an anisotropic nanostructure having elongated {100} and {110} facets.

10. The method of claim 1, wherein oxidatively etching one surface of the seed comprises removing bromide from a surface of the seed.

11. The method of claim 10, wherein oxidatively etching one surface of the seed comprises removing bromide from a surface of the seed with oxygen, chloride, or water.

12. The method of claim 1 further comprising adding a capping agent to the seed.

13. The method of claim 12, wherein the capping agent is a poly(vinylpyrrolidone).

14. The method of claim 1, wherein an aspect ratio of the anisotropic nanostructure is from about 1.1 to about 20.

15. The method of claim 1, wherein the anisotropic nanostructure is a palladium or platinum nanobar.

16. The method of claim 1, wherein the anisotropic nanostructure is a palladium or gold nanorod.

17. The method of claim 1, wherein the anisotropic nanostructure is a palladium or gold five-fold twinned nanorod.

* * * * *